(12) United States Patent
Lee et al.

(10) Patent No.: US 11,243,583 B2
(45) Date of Patent: Feb. 8, 2022

(54) COOLER WITH WIRELESS CHARGING FUNCTION FOR MOBILE ELECTRONIC DEVICE

(71) Applicant: Samsung Electronics Co., Ltd., Gyeonggi-do (KR)

(72) Inventors: Seunghoon Lee, Gyeonggi-do (KR);
Yongbum Kim, Gyeonggi-do (KR);
Jihong Kim, Gyeonggi-do (KR);
Sangwoo Park, Gyeonggi-do (KR);
Minchang Shim, Gyeonggi-do (KR);
Sangwon Lee, Gyeonggi-do (KR);
Sungbok Lee, Gyeonggi-do (KR);
Changhyung Lee, Gyeonggi-do (KR);
Hanshil Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/726,401

(22) Filed: Dec. 24, 2019

(65) Prior Publication Data

US 2020/0201402 A1 Jun. 25, 2020

(30) Foreign Application Priority Data

Dec. 24, 2018 (KR) .......................... 10-2018-0168490
Feb. 19, 2019 (KR) .......................... 10-2019-0019577

(51) Int. Cl.
*G06F 1/20* (2006.01)
*H05K 7/20* (2006.01)
(Continued)

(52) U.S. Cl.
CPC .............. *G06F 1/20* (2013.01); *H02J 7/0068* (2013.01); *H02J 50/10* (2016.02); *H02J 50/40* (2016.02); *H05K 7/20136* (2013.01)

(58) Field of Classification Search
CPC . G06F 1/20; H02J 7/0068; H02J 50/40; H02J 50/10; H05K 7/20136
(Continued)

(56) References Cited

U.S. PATENT DOCUMENTS 6,950,316 B2 9/2005 Pan et al.
9,445,524 B2 * 9/2016 Lofy .................. H05K 7/20845
(Continued)

FOREIGN PATENT DOCUMENTS

JP 2014-110580 A 6/2014
KR 10-2011-0116892 A 10/2011
WO 2018/165040 A1 9/2018

OTHER PUBLICATIONS

International Search Report dated Apr. 28, 2020.
European Search Report dated Sep. 15, 2021.

*Primary Examiner* — Richard V Muralidar
(74) *Attorney, Agent, or Firm* — Cha & Reiter, LLC

(57) ABSTRACT

Disclosed is a cooler according to various embodiments of the disclosure. The cooler may have an electronic device mounted thereon, which includes a front surface on which a display area is formed and a rear surface opposite the front surface. The cooler may include a housing including a first surface, a second surface opposite the first surface, and a third surface that surrounds an interior space between the first surface and the second surface, the first surface including a seating area on which the rear surface of the electronic device is seated and a recess area spaced apart from the rear surface of the electronic device by a predetermined gap, and a fan disposed in the interior space of the housing and including a rotary shaft formed in a direction toward the first surface from the second surface.

10 Claims, 16 Drawing Sheets

(51) Int. Cl.
*H02J 50/40* (2016.01)
*H02J 50/10* (2016.01)
*H02J 7/00* (2006.01)

(58) Field of Classification Search
USPC .......... 320/108; 361/679.46, 679.48, 679.49,
361/679.5, 688, 692, 695
See application file for complete search history.

(56) References Cited

U.S. PATENT DOCUMENTS

| | | | |
|---|---|---|---|
| 9,451,723 B2 * | 9/2016 | Lofy | H05K 7/20845 |
| 9,836,101 B1 | 12/2017 | Saravis | |
| 10,281,367 B1 | 5/2019 | Schindler, III | |
| 10,409,342 B2 | 9/2019 | Saravis | |
| 10,439,423 B2 * | 10/2019 | Lachnitt | H04B 5/0037 |
| 2005/0059443 A1 | 3/2005 | Pan et al. | |
| 2006/0061964 A1 | 3/2006 | Cheng | |
| 2007/0152633 A1 | 7/2007 | Lee | |
| 2015/0017905 A1 | 1/2015 | Li et al. | |
| 2016/0276866 A1 * | 9/2016 | Lachnitt | H04M 1/04 |
| 2017/0179767 A1 * | 6/2017 | Chang | H02J 50/12 |
| 2018/0005095 A1 | 1/2018 | Schindler, III | |
| 2018/0076649 A1 | 3/2018 | Burns | |
| 2018/0081409 A1 | 3/2018 | Saravis | |
| 2018/0177075 A1 * | 6/2018 | Kweon | H01F 38/14 |
| 2018/0288898 A1 | 10/2018 | Jeong et al. | |
| 2018/0307284 A1 | 10/2018 | Saravis | |
| 2019/0115781 A1 * | 4/2019 | Feng | H02J 7/0044 |
| 2019/0324508 A1 | 10/2019 | Saravis | |
| 2019/0341884 A1 | 11/2019 | Walker | |
| 2020/0091755 A1 * | 3/2020 | Larsson | H02J 7/025 |
| 2021/0161034 A1 * | 5/2021 | Jeong | H02J 7/0044 |

* cited by examiner

COOLER WITH WIRELESS CHARGING FUNCTION FOR MOBILE ELECTRONIC DEVICE

CROSS-REFERENCE TO RELATED APPLICATION(S)

This application is based on and claims priority under 35 U.S.C. § 119 to Korean Patent Application No. 10-2019-0019577, filed on Feb. 19, 2019 and Korean Patent Application No. 10-2018-0168490, filed on Dec. 24, 2018 in the Korean Intellectual Property Office, the disclosure of which is incorporated by reference herein its entirety.

BACKGROUND

1. Field

The instant disclosure generally relates to a cooler with a charging function for a mobile electronic device.

2. Description of Related Art

Games or multimedia contents, which could be implemented only by PCs, are increasingly being implemented in mobile electronic devices because the processing power of the mobile electronic devices have increased. Typically, these types of content require high processing power and consume a lot of battery power. So as to smoothly drive the games or the multimedia contents on the mobile electronic devices, heat generated from internal parts (e.g., a processor) has to be dissipated.

The above information is presented as background information only to assist with an understanding of the disclosure. No determination has been made, and no assertion is made, as to whether any of the above might be applicable as prior art with regard to the disclosure.

SUMMARY

Conventionally, there may be a cooling device for a mobile electronic device which has a mounting-type structure that includes a fan that blows air toward the rear surface of the mobile electronic device. Due to the mounting-type structure, the portability of the mobile electronic device may be deteriorated, and the mobile electronic device may not be efficiently cooled by simply blowing air toward the rear surface of the mobile electronic device. Furthermore, the conventional cooling device may not stably hold the mobile electronic device. In addition, battery consumption may be increased when contents requiring high processing power are driven by using the mobile electronic device. Further, if the mobile electronic device is charged in this scenario via a wire to alleviate battery life concerns, the wire may reduce the mobility of the mobile electronic device.

In accordance with an aspect of the disclosure, a cooler mounted on an electronic device including a front surface on which a display area is formed and a rear surface opposite the front surface includes a housing including a first surface, a second surface opposite the first surface, and a third surface that surrounds an interior space between the first surface and the second surface, the first surface including a seating area on which the rear surface of the electronic device is seated and a recess area spaced apart from the rear surface of the electronic device by a predetermined gap, and a fan disposed in the interior space of the housing and including a rotary shaft formed in a direction toward the first surface from the second surface. The recess area includes a bottom surface spaced apart from the rear surface of the electronic device by the predetermined gap and an inner wall formed between the bottom surface and the seating area and having a first opening formed through the inner wall in a direction toward the fan disposed in the interior space of the housing. The third surface has a second opening formed through the third surface in a direction toward the fan disposed in the interior space of the housing. The fan is configured to introduce air outside the housing into the interior space of the housing through the second opening and discharge the outside air to a space between the rear surface of the electronic device and the bottom surface through the first opening.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

With regard to the description of the drawings, identical or similar reference numerals may be used to refer to identical or similar components.

DETAILED DESCRIPTION

Hereinafter, various embodiments of the disclosure will be described with reference to the accompanying drawings. However, those of ordinary skill in the art will recognize that modification, equivalent, and/or alternative on the various embodiments described herein can be variously made without departing from the scope and spirit of the disclosure.

Aspects of the instant disclosure are to address at least the above-mentioned problems and/or disadvantages and to provide at least the advantages described below. Accordingly, an aspect of the disclosure is to provide a cooler for a mobile electronic device that is capable of dissipating heat while maintaining the portability of the mobile electronic device. In addition, another aspect of the disclosure is to provide an accessory for a mobile electronic device that is capable of providing a wireless charging function as well as a cooling function so as to enable the mobile electronic device to effectively drive contents requiring high processing power.

Figure 1:
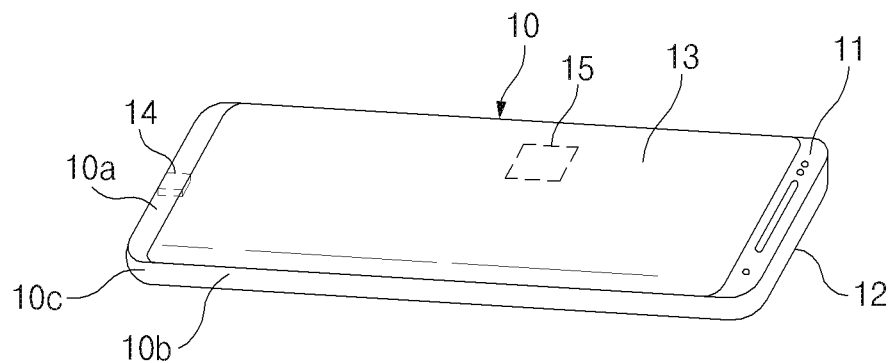
FIG. 1 is a view illustrating a cooler for a mobile electronic device, the mobile electronic device coupled to the cooler, and an air flow path of the cooler according to an embodiment.
Figure 1:
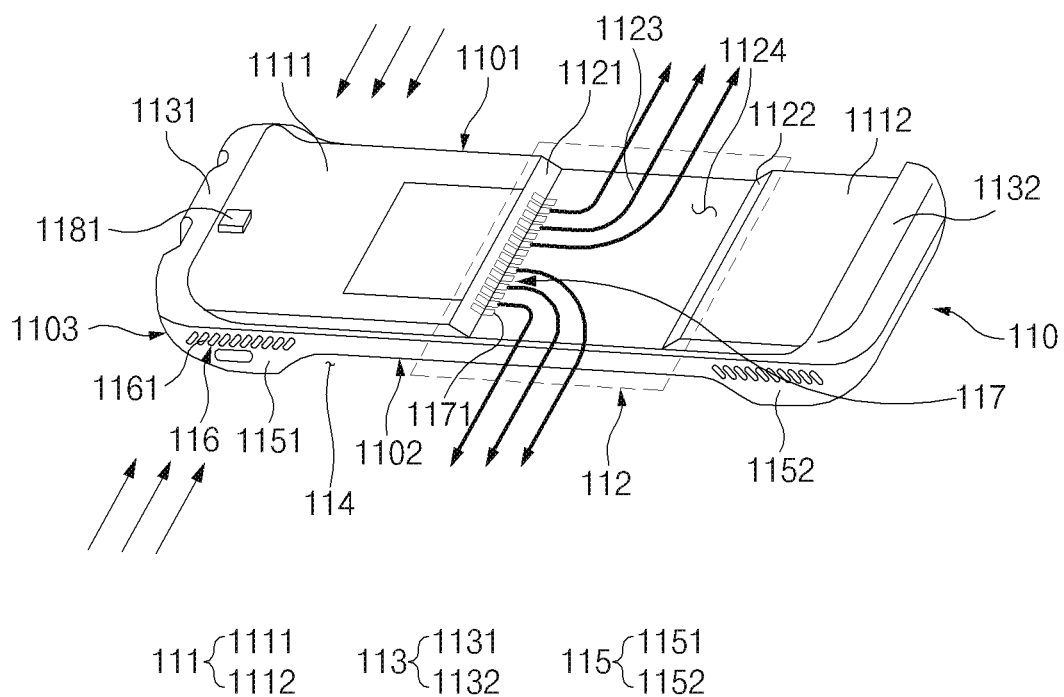
Figure 2:
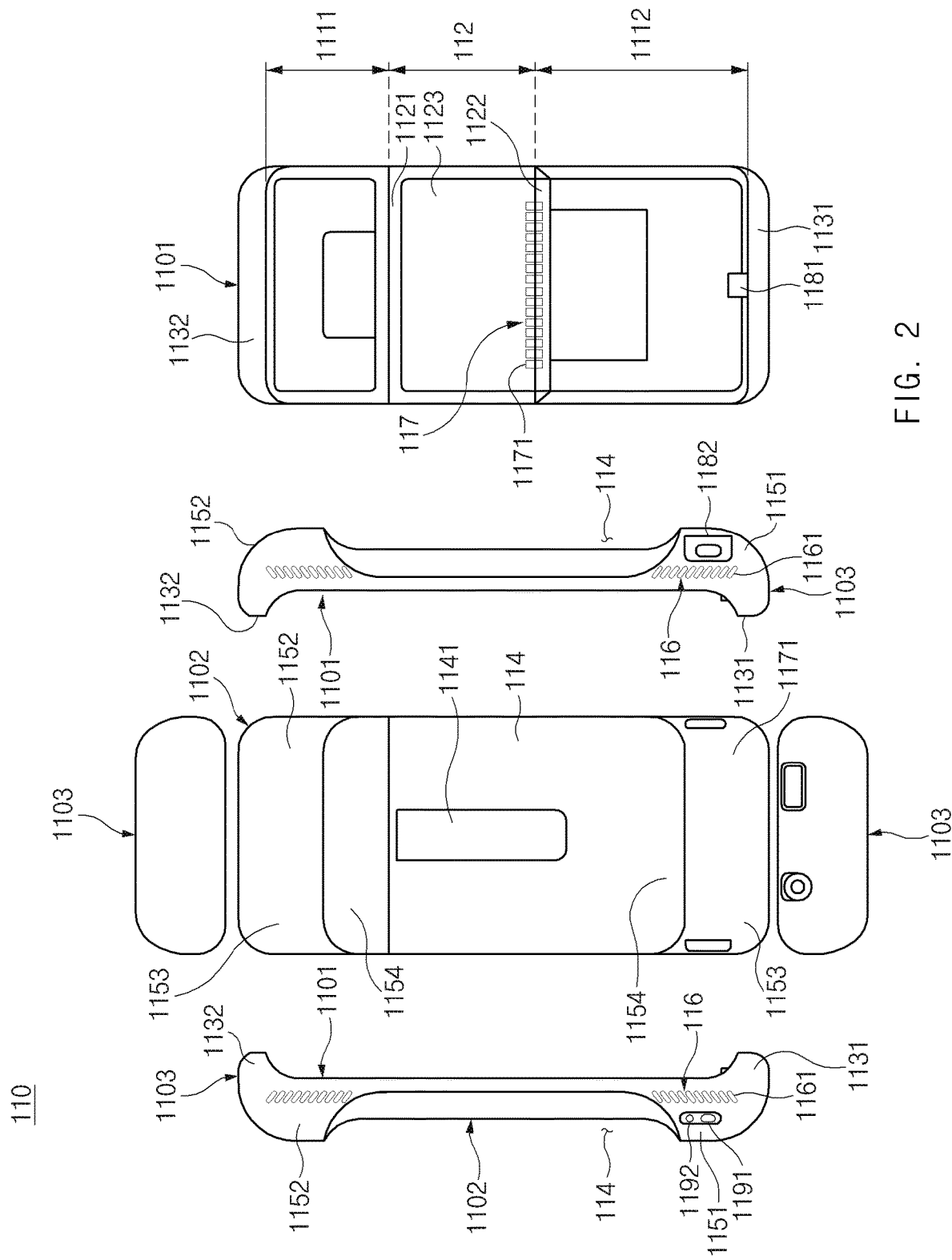
FIG. 2 is plan views of the cooler for the mobile electronic device according to an embodiment.

FIG. 1 is a view illustrating a cooler for a mobile electronic device, the mobile electronic device coupled to the cooler, and an air flow path of the cooler according to an embodiment. FIG. 2 is plan views of the cooler for the mobile electronic device according to an embodiment.

In an embodiment, the cooler (hereinafter referred to as the cooler 100) for the mobile electronic device (shown here as including the electronic device 10) may include a housing 110 that includes a first surface 1101 on which the mobile electronic device 10 is seated, a second surface 1102 opposite the first surface 1101, and a third surface 1103 (e.g., a side surface) that is formed between the first surface 1101 and the second surface 1102.

The electronic device 10 disclosed herein may be a smartphone. A display area 13 that shows visual information may be formed on a front surface 11 and/or a rear surface 12 of the electronic device 10. The electronic device 10 may include a side surface formed between the front surface 11 and the rear surface 12.

Referring to FIGS. 1 and 2, the side surface of the electronic device 10 is illustrated as including short side portions 10a that have a first length and in which at least one connector 14 is disposed, long side portions 10b that have a second length longer than the first length and in which one or more physical buttons are disposed, and corner portions 10c that connect the short side portions 10a and the long side portions 10b. However, the side surfaces of the electronic device 10 are not necessarily so limited.

In an embodiment, the first surface 1101 of the housing 110 may include seating areas 111, on each of which parts of the electronic device 10 is seated, and a recess area 112 formed to be lower than the seating areas 111 in a direction toward the interior of the housing 110 (e.g., toward the second surface 1102).

In the illustrated embodiment, the first surface 1101 may include a first seating area 1111, a second seating area 1112, and the recess area 112 formed between the first seating area 1111 and the second seating area 1112. The first surface 1101 may include fixing portions 113 that are formed on the periphery of the first surface 1101 to surround the side surfaces of the electronic device 10. Referring to FIG. 1, the fixing portions 113 may be formed to surround the edges of the short side portions 10a of the electronic device 10.

Referring to FIG. 1, the first surface 1101 may include a first fixing portion 1131 formed to surround a portion of the periphery of the electronic device 10. The first surface 1101 may include a second fixing portion 1132 formed to surround another portion of the periphery of the electronic device 10. The first fixing portion 1131 and the second fixing portion 1132 may surround the edges of the opposing short side portions 10a of the electronic device 10.

Accordingly, the first fixing portion 1131 and the second fixing portion 1132 may be disposed to face each other. The electronic device 10 may be disposed between the first fixing portion 1131 and the second fixing portion 1132.

In the illustrated embodiment, the first fixing portion 1131 may have a connector 1181 formed thereon, which can be coupled with the connector 14 of the electronic device 10 to electrically connect the electronic device 10 and the cooler 100. The connector 1181 may be formed on the first fixing portion 1131 in the direction toward the second fixing portion 1132.

However, the specific shape and position of the connector 1181 may vary depending on the shape and position of the connector 14 included in the electronic device 10. For example, the housing 110 may include a pair of first edges corresponding to the short side portions 10a of the electronic device 10 and a pair of second edges corresponding to the long side portions 10b of the electronic device 10. Referring to the drawings, the first fixing portion 1131 and the second fixing portion 1132 are illustrated as being formed at the pair of first edges. However, this is due to the connector 14 of the electronic device 10 being disposed in the short side portion 10a of the electronic device 10, and the first fixing portion 1131 and the second fixing portion 1132 are not necessarily limited to being formed at the first edges.

In an embodiment, portions of the rear surface 12 of the electronic device 10 may be disposed on the first seating area 1111 and the second seating area 1112, and portions (e.g., the short side portions 10a and the corner portions 10c) of the side surface of the electronic device 10 may be disposed on the first fixing portion 1131 and the second fixing portion 1132. The first fixing portion 1131 and the second fixing portion 1132 may each extend to the front surface 11 of the electronic device 10 to cover part of the periphery of the front surface 11 of the electronic device 10.

Referring to FIGS. 1 and 2, the first seating area 1111 and the first fixing portion 1131 may form a recess in which one of the edges of the pair of short side portions 10a of the electronic device 10 is substantially disposed. The second seating area 1112 and the second fixing portion 1132 may form a recess in which the other one of the edges of the pair of short side portions 10a of the electronic device 10 is substantially disposed.

In the illustrated embodiment, the first surface 1101 of the housing 110 of the cooler 100 may include the recess area 112 formed between the first seating area 1111 and the second seating area 1112.

The recess area 112 may include a bottom surface 1123 formed to be lower than surfaces of the first seating area 1111 and the second seating area 1112 in the direction toward the interior of the housing 110 (e.g., the direction toward the second surface 1102). The recess area 112 may further include a first inner wall 1121 connecting the bottom surface 1123 and the first seating area 1111, and a second inner wall 1122 connecting the bottom surface 1123 and the second seating area 1112.

In an embodiment, the bottom surface 1123 may be spaced apart from the rear surface 12 of the electronic device 10 by a predetermined gap.

In an embodiment, at least one of the first inner wall 1121 and the second inner wall 1122 may have a first opening 1171 formed therein, which connects to the interior of the housing 110. In this case, a plurality of first openings 1171 may be formed. The first inner wall 1121 and the second inner wall 1122 may be connected with the first seating area 1111 and the second seating area 1112, respectively, to form a step or an oblique angle.

In an embodiment, the first surface 1101 of the housing 110 of the cooler 100 may include an exhaust area 117 including the plurality of first openings 1171 formed in at least one of the first inner wall 1121 and the second inner wall 1122.

Arrows illustrated in FIG. 1 represent the air flow path of the cooler 100. The recess 112 may define an open space between the bottom surface 1123 and the rear surface 12 of the electronic device 10. The recess 112 may be formed such that air released from the first openings 1171 moves through the open space to escape to the external environment surrounding the cooler 100.

The cooler 100 according to an embodiment may have a structure in which outside air is introduced into the interior space of the housing 110 through second openings 1161 formed in a second cover 122 (illustrated in FIG. 5) and is released to the recess 112 through the first openings 1171. Parts of the electronic device 10 that are primarily responsible for heat-generation may be disposed over the recess 112, and thus the electronic device 10 may be effectively cooled.

In an embodiment, the housing 110 may include a fan therein, which enables a flow of air.

Referring to FIG. 2, the second surface 1102 of the housing 110 of the cooler 100 may include a first holding portion 1151, at least part of which is formed in an area corresponding to the first seating area 1111, a second holding portion 1152, at least part of which is formed in an area corresponding to the second seating area 1112, and a depression 114 formed between the first holding portion 1151 and the second holding portion 1152.

The first holding portion 1151 and the second holding portion 1152 may be at least partially curved to provide grip for the user holding the cooler 100. The first holding portion 1151 and the second holding portion 1152 may each include a first curved surface 1153 connected to the third surface 1103 of the cooler 100 and a second curved surface 1154 connected to the depression 114.

Referring to FIG. 2, the second openings 1161 may be formed in the third surface 1103 of the housing 110 of the cooler 100. The second openings 1161 may in fluidic communication with the first openings 1171 through the interior of the housing 110.

In an embodiment, the third surface 1103 of the housing 110 of the cooler 100 may include intake areas 116, each of which includes the plurality of second openings 1161 that are formed through the third surface 1103 to connect to the interior of the housing 110. Referring to FIG. 2, the intake areas 116 may be formed on opposing portions of the third surface 1103 of the housing 110.

In an embodiment, the cooler 100 may include a charging terminal 1182, a power button 1191, and an LED indicator 1192, which are all disposed on the third surface 1103 of the housing 110. The charging terminal 1182 may be electrically connected with a battery and a PCB that are disposed in the housing 110. The LED indicator 1192 may provide, to the user, information regarding the battery level or whether the fan operates. The power button 1191 may be electrically connected with the PCB disposed in the housing 110.

Figure 3A:
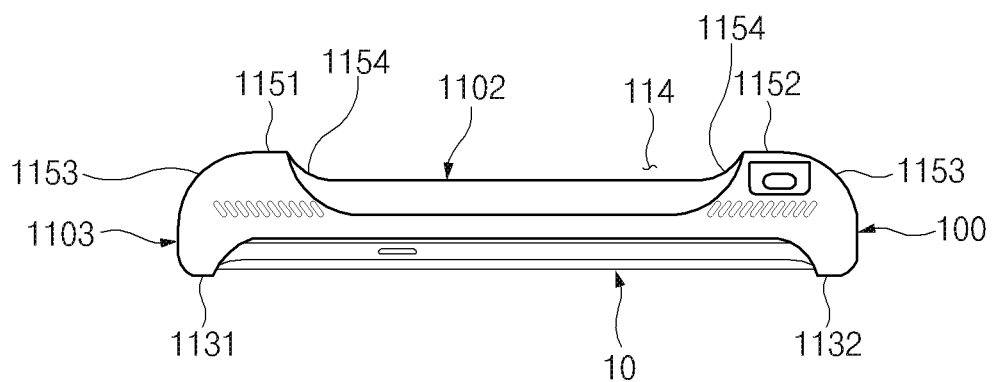
FIG. 3A and FIG. 3B are views illustrating a state in which the cooler for the mobile electronic device is held by a user according to an embodiment.
Figure 3B:
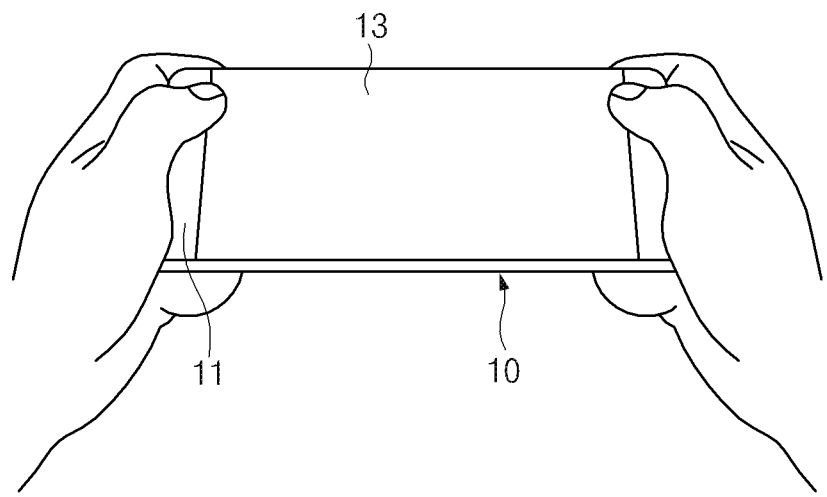
Figure 4:
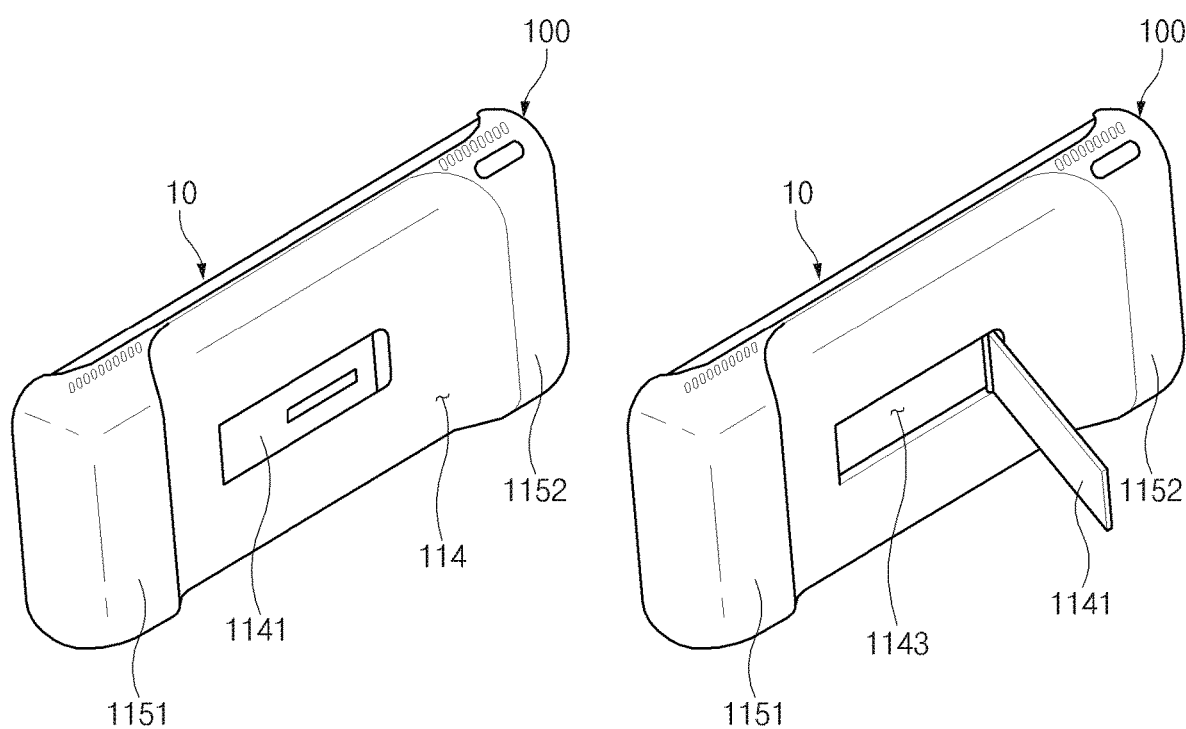
FIG. 4 are perspective views illustrating a state in which the cooler for the mobile electronic device is supported in an upright position by a lever according to an embodiment.

FIGS. 3A-3B are views illustrating a state in which the cooler for the mobile electronic device is held by a user according to an embodiment. FIG. 4 are perspective views illustrating a state in which the cooler for the mobile electronic device is supported in an upright position by a lever according to an embodiment.

Referring to FIG. 3, the cooler 100 may include the first holding portion 1151 and the second holding portion 1152 to allow for the user to better grip the cooler 100. The first holding portion 1151 and the second holding portion 1152 may be formed on the second surface 1102.

The depression 114 may be formed between the first holding portion 1151 and the second holding portion 1152. The first holding portion 1151 and the second holding portion 1152 may each include the first curved surface portion 1153 extending to the depression 114 and the second curved surface portion 1154 extending to the side surface 1103.

In the illustrated embodiment, the cooler 100 having the electronic device 10 coupled thereto may be held such that the first curved surface portion 1153 and the second curved surface portion 1154 are at least partially surrounded by the user's hands. At this time, a portion of the front surface 11 of the electronic device 10 may also be surrounded by the user's hands.

The cooler 100 according to an embodiment may be stably held by the user due to the holding portions 1151 and 1152 formed on the second surface 1102 that allow for a better grip.

In the illustrated embodiment, the cooler 100 may include a lever member 1141 formed on the second surface 1102. The lever member 1141 may be formed in the depression 114 formed between the first holding portion 1151 and the second holding portion 1152. At least part of the lever member 1141 may be disposed in a recess 1143 formed on the second surface 1102. One end portion of the lever member 1141 may be coupled to an inner wall of the recess 143 so as to be rotatable, and an opposite end portion of the lever member 1141 may be moved to have a predetermined angle with respect to the second surface 1102. Accordingly, the cooler 100 may be obliquely disposed at a predetermined angle with respect to the ground, by allowing the opposite end portion of the lever member 1141 to be supported on the ground.

Figure 5:
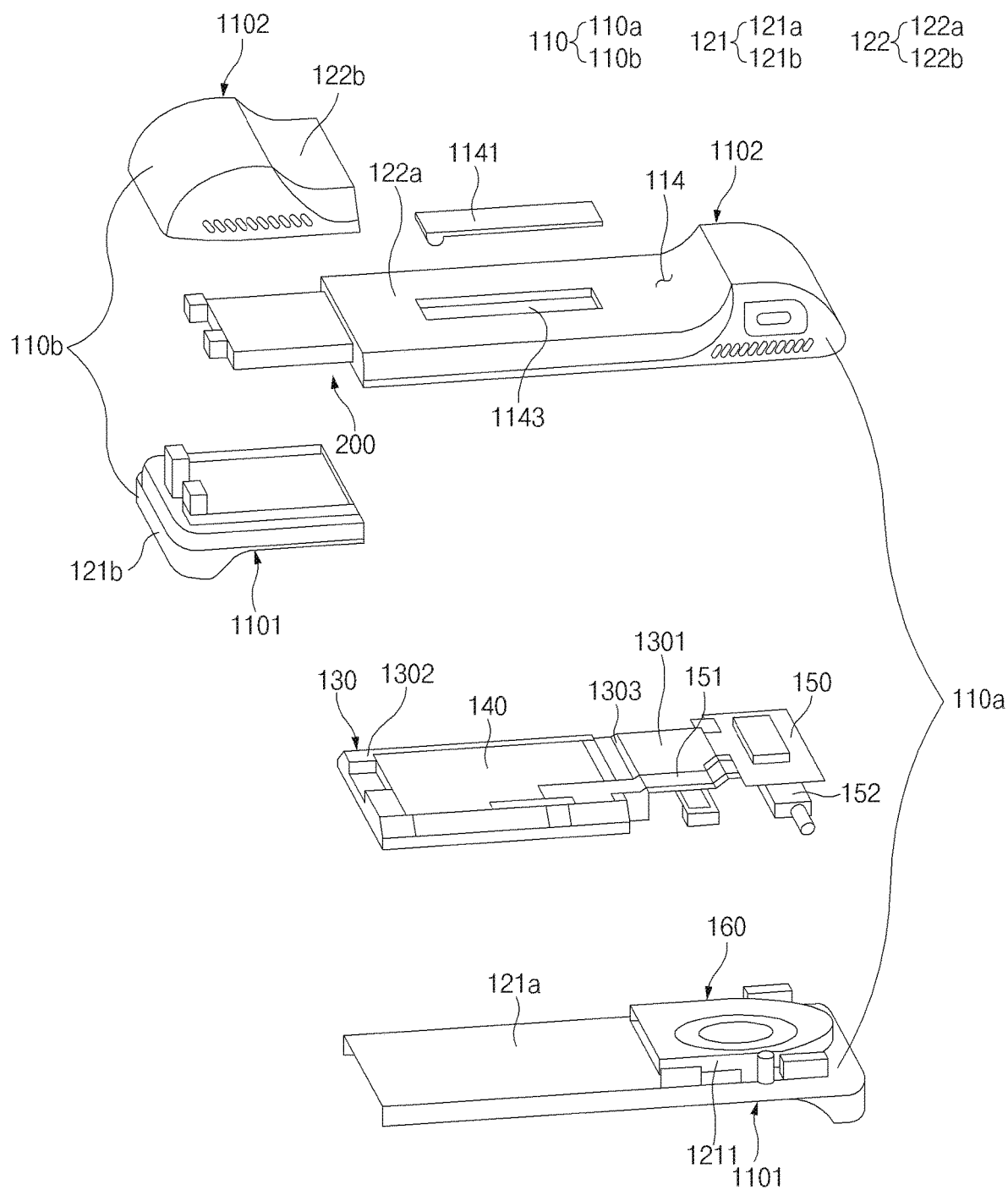
FIG. 5 is an exploded perspective view of the cooler for the mobile electronic device according to an embodiment.

FIG. 5 is an exploded perspective view of the cooler for the mobile electronic device according to an embodiment.

In an embodiment, the cooler 100 may include a first housing 110a, a second housing 110b, and a sliding structure 200 by which the first housing 110a and the second housing 110b are slidably coupled together. The sliding structure 200 will be described below in detail with reference to FIG. 9 and the following drawings, and components included in the housing 110 are described with reference to FIG. 3.

In the illustrated embodiment, the cooler 100 may include a bracket 130, a PCB 150, a battery 140, and a fan assembly 160 that are disposed in the housing 110. In different embodiments, the bracket 130, the PCB 150, the battery 140, and the fan assembly 160 may be disposed in the first housing 110a or the second housing 110b.

In an embodiment, the housing 110 may include the first cover 121 and the second cover 122, which is coupled to the first cover 121, to form an interior space inside. In this case, the first cover 121 may substantially form the first surface 1101 of the housing 110 (e.g., the first surface 1101 of FIG.

2), and the second cover 122 may substantially form the second surface 1102 (e.g., the second surface 1102 of FIG. 2) and the third surface 1103 (e.g., the third surface 1103 of FIG. 2).

In the illustrated embodiment, the first cover 121 may include a first part 121a that forms the first housing 110a and a second part 121b that forms the second housing 110b. In the illustrated embodiment, the second cover 122 may include a first part 122a that forms the first housing 110a and a second part 122b that forms the second housing 110b.

In the illustrated embodiment, the first part 121a of the first cover 121 may be coupled with the first part 122a of the second cover 122, and the second part 121b of the first cover 121 may be coupled with the second part 122b of the second cover 122. Accordingly, the first cover 121 and the second cover 122 may form a space inside. In this case, the bracket 130, the PCB 150, the battery 140, and the fan assembly 160 may be disposed in the space.

In the illustrated embodiment, the first cover 121 may form a first seating area (e.g., the first seating area 1111 of FIG. 2), a second seating area (e.g., the second seating area 1112 of FIG. 2), a recess area (e.g., the recess area 112 of FIG. 2), a first fixing portion (e.g., the first fixing portion 1131 of FIG. 2), and a second fixing portion (e.g., the second fixing portion 1132 of FIG. 2).

In the illustrated embodiment, the second cover 122 may form a first holding portion (e.g., the first holding portion 1151 of FIG. 2), a second holding portion (e.g., the second holding portion 1152 of FIG. 2), and a depression (e.g., the depression 114 of FIG. 2).

In the illustrated embodiment, the bracket 130 may be disposed between the first cover 121 and the second cover 122. The PCB 150, the battery 140, and an FPCB 151 electrically connecting the PCB 150 and the battery 140 may be disposed on the bracket 130. The PCB 150, the battery 140, and the FPCB 151 may be disposed between the bracket 130 and the second cover 122. For example, the PCB 150, the battery 140, and the FPCB 151 may be disposed on a surface of the bracket 130 that faces the second cover 122.

In an embodiment, a charging terminal 152 may be coupled to the PCB 150 and may be exposed on the third surface 1103 of the housing 110 that is formed by the second cover 122. The charging terminal 152 may be electrically connected with the PCB 150. In an embodiment, the charging terminal 152 may include a USB.

In the illustrated embodiment, the bracket 130 may include a first portion 1301 on which the PCB 150 is disposed and a second portion 1302 on which the battery 140 is disposed and that forms a step with the first portion 1301. The first portion 1301 and the second portion 1302 may be connected by an inclined surface 1303 having a predetermined slope. The first portion 1301 may be formed to be closer to the second cover 122 than the second portion 1302. That is, the inclined surface 1303 may be obliquely formed from the first portion 1301 to the second portion 1302 in the direction toward the first cover 121.

In an embodiment, the fan assembly 160 may be disposed between the bracket 130 and the first cover 121. The fan assembly 160 may be disposed in the space formed by the first portion 1301 of the bracket 130, the inclined surface 1303 of the bracket 130, and the inside of the first cover 121. The first portion 1301 of the bracket 130 may be formed between the fan assembly 160 and the PCB 150. For example, the fan assembly 160 may be fixed by an internal structure 1211 formed on the inside of the first cover 121.

Figure 6:
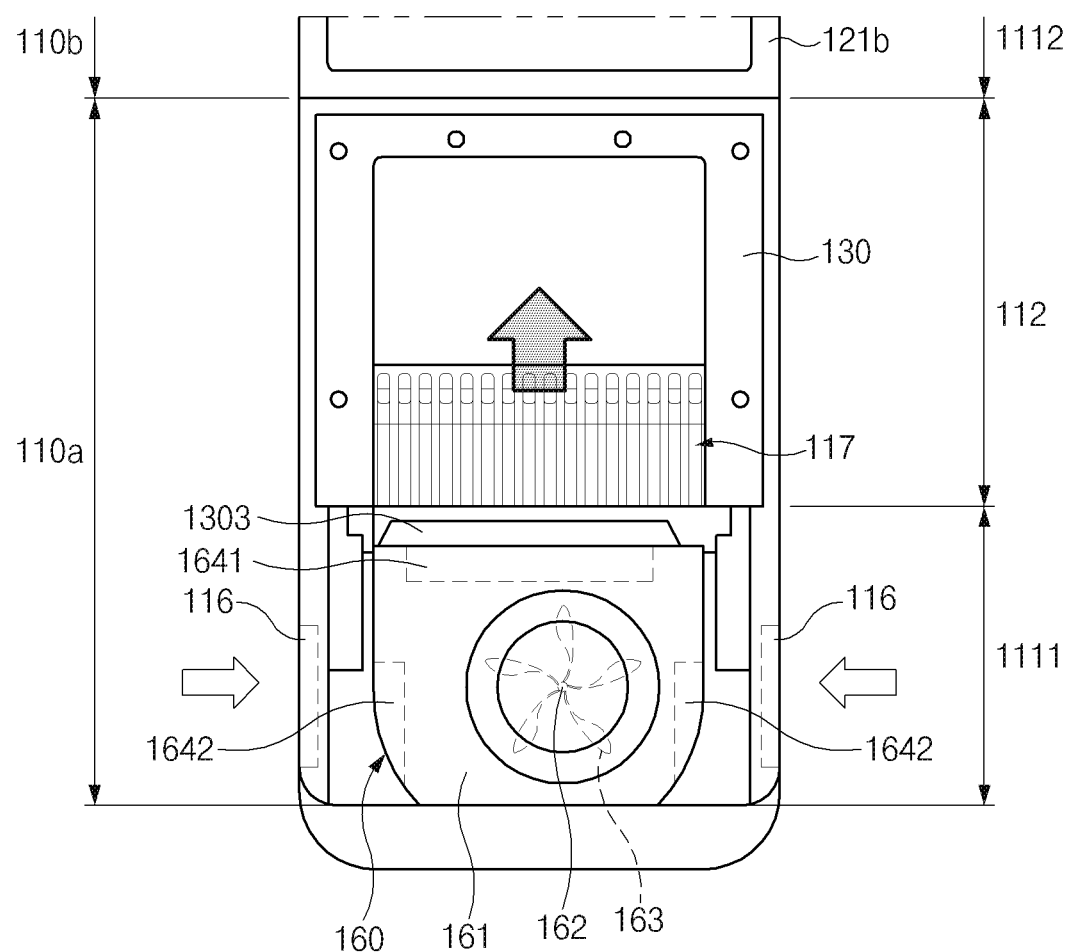
FIG. 6 is a view illustrating the interior of a housing of the cooler for the mobile electronic device and an air flow path according to an embodiment.

In an embodiment, as shown in FIG. 6, the fan assembly 160 may include a fan housing 161, a rotary shaft 162 formed in the fan housing 161, rotary blades 163 coupled to the rotary shaft 162 so as to be rotatable about the rotary shaft 162, air inlets 1642 that are formed on the fan housing 161 and that correspond to the intake areas 116 formed on the second cover 122, and an air outlet 1641 that is formed on the fan housing 161 and that corresponds to the exhaust area 117 formed on the first cover 121.

In the illustrated embodiment, the fan assembly 161 may be coupled to the internal structure 1211 formed on the inside of the first cover 121. The fan assembly 161 may include a centrifugal fan by which air flows from the center of the fan in the circumferential direction. The thickness of the cooler 100 according to an embodiment may be minimized due to it including a centrifugal fan rather than an axial-flow fan by which intake and exhaust processes are performed in the direction parallel to the rotary shaft 162.

FIG. 6 is a view illustrating the interior of the housing 110 of the cooler for the mobile electronic device and an air flow path according to an embodiment. To illustrate the interior, part of the first cover 121 is removed in FIG. 6.

Referring to FIG. 6, the fan assembly 160 may be disposed in the first housing 110a. The fan assembly 160 may be disposed in an area corresponding to the first seating area 1111 of the first housing 110a.

In the illustrated embodiment, the fan assembly 160 may be configured such that the rotary blades 163 rotating about the rotary shaft 162 to introduce air into the fan housing 161 through the air inlets 1642 and release the air from the fan housing 161 through the air outlet 1641. For example, the fan assembly 160 may include a centrifugal fan capable of intake and release of air in the centripetal direction (e.g., the direction toward the rotary shaft 162). The fan assembly 160 may introduce air outside the housing 110 into the fan housing 161 through the second openings 1161 of the intake areas 116 connected with the air inlets 1642 and may blow the air in the fan housing 161 to the recess area 112 through the first openings 1171 of the exhaust area 117 connected with the air outlet 1641.

In the illustrated embodiment, the rotary shaft 162 of the fan assembly 160 may be formed in the direction toward the first surface 1101 of the first housing 110a from the second surface 1102 of the first housing 110a. The extension direction of the rotary shaft 162 may be substantially perpendicular to the flow direction of air. For example, the fan assembly 160 may be a centrifugal fan that allows air to flow in the direction toward the rotary shaft 162, with the rotary shaft 162 as the center.

In the illustrated embodiment, outside air introduced into the fan housing 161 may be moved to the recess area 112 through the air outlet 1641, which is formed on the fan housing 161, and the plurality of first openings 1171, which connect to the air outlet 1641, by the plurality of rotary blades 163 rotating about the rotary shaft 162. The portion around the air outlet 1641 of the fan housing 161 may be connected with the inclined surface 1303 formed by the bracket 130. For example, the portion around the air outlet 1641 of the fan housing 161, the inclined surface 1303 of the bracket 130, and the inside of the first housing 110a may form a fluid channel through which air flows.

Figure 7A:
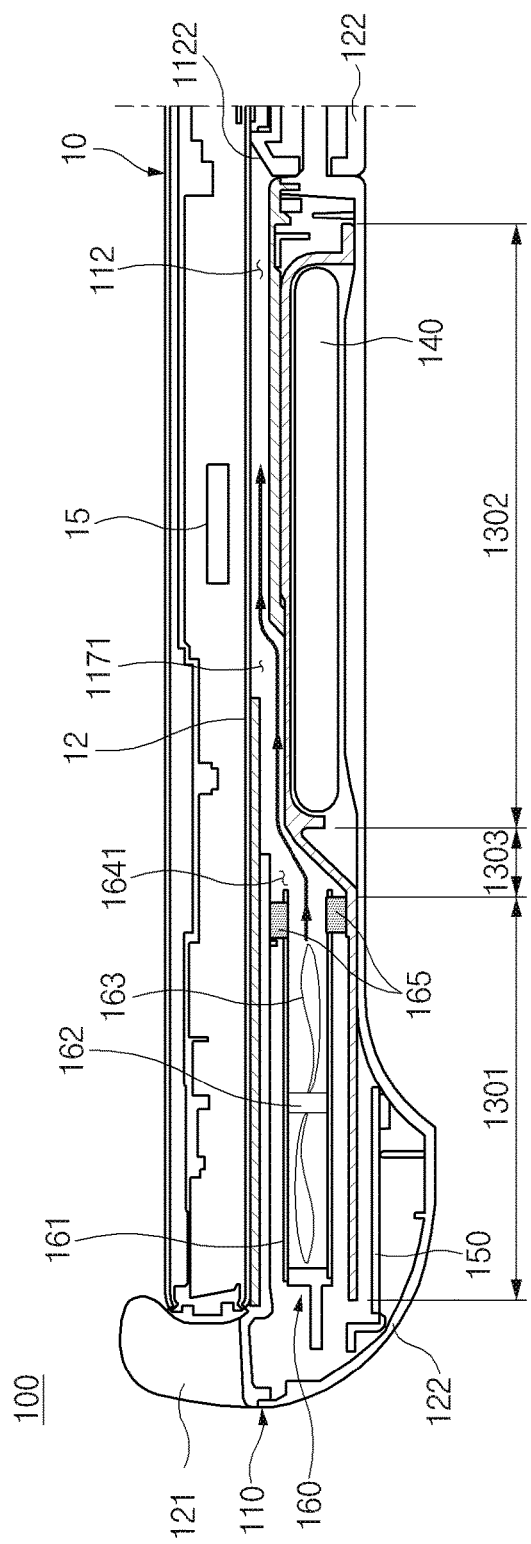
FIG. 7A and FIG. 7B are sectional views of the cooler for the mobile electronic device according to an embodiment.
Figure 7B:
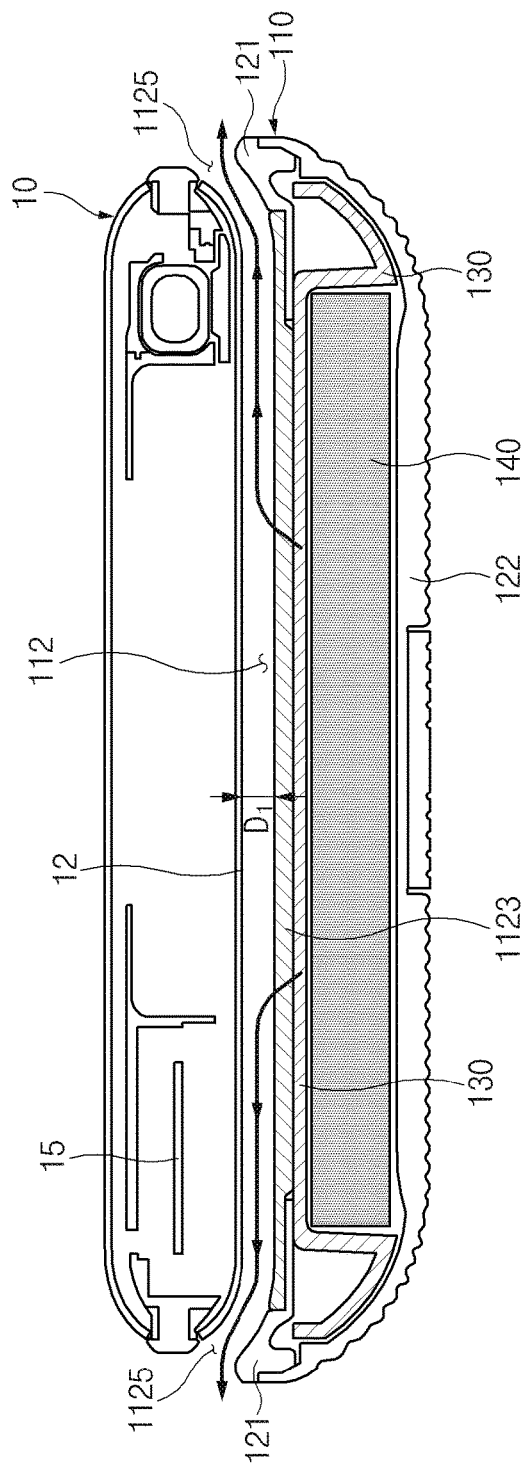

FIGS. 7A-7B are sectional views of the cooler for the mobile electronic device according to an embodiment.

In an embodiment, the cooler 100 may include the first cover 121, the second cover 122 that forms the interior space together with the first cover 121, the bracket 130 disposed in the interior space, the fan assembly 160 disposed in the interior space, and the PCB 150 and the battery 140 that are also disposed in the interior space.

In an embodiment, the fan assembly 160 may include the fan housing 161, the rotary shaft 162 formed in the fan housing 161, and the plurality of rotary blades 163 coupled to the rotary shaft 162.

In an embodiment, the air outlet 1641 connecting to the first openings 1171 may be formed on the fan housing 161. The rotary shaft 162 may be formed in the direction from the second cover 122 to the first cover 121. As the rotary blades 163 rotate, air may flow into the recess 112 through the air outlet 1641 and the first openings 1171.

Referring to FIG. 7B, the electronic device 10 may be mounted on the cooler 100 such that the rear surface 12 of the electronic device 10 is spaced apart from a bottom surface 1123 of the recess 112 by a predetermined gap D1.

Referring to FIG. 7B, the recess 112 may be formed in a shape that is open in the direction toward the third surface (e.g., the third surface 1103 of FIG. 2) of the housing (e.g., the housing 110 of FIG. 2). Air released from the first openings 1171 to the recess 112 may be discharged outside the housing 110 through the open portions 1125.

In an embodiment, the fan assembly 160 may be disposed between the bracket 130 and the first cover 121. The fan assembly 160 may be disposed in the area corresponding to the first seating area 1111 of the housing 110.

In an embodiment, a backflow prevention member 165 may be coupled to the fan housing 161. The backflow prevention member 165 may be disposed on the outer circumferential surface of the air outlet 1641. The backflow prevention member 165 may be formed between the fan housing 161 and the first cover 121 and between the fan housing 161 and the second portion 1302 of the bracket 130. For example, the backflow prevention member 165 may be a ring member coupled to the fan housing 161 along the outer circumferential surface of the air outlet 1641. The backflow prevention member 165 may prevent air released through the air outlet 1641 from flowing back to the space between the first cover 121 and the fan housing 161 and the space between the second cover 122 and the fan housing 161.

In an embodiment, the battery 140 may be disposed between the bracket 130 and the second cover 122. At least part of the battery 140 may be disposed in an area corresponding to the recess 112 of the housing 110.

In an embodiment, the bracket 130 may include the first portion 1301 disposed on the inside of the second cover 122, the second portion 1302 disposed between the battery 140 and the first cover 121, and the inclined surface 1303 formed between the first portion 1301 and the second portion 1302 and inclined in the direction toward the first cover 121 from the first portion 1301.

In an embodiment, as the rotary blades 163 of the fan assembly 160 are rotated, outside air introduced into the fan housing 161 may flow from the air outlet 1641 formed on the fan housing 161 to the recess 112 through the first openings 1171 formed in the recess 112. The outside air may move along the fluid channel formed from the air outlet 1641 of the fan housing 161 to the first openings 1171.

In the illustrated embodiment, the fluid channel may be formed by the air outlet 1641 of the fan housing 161, the backflow prevention member 165, the inclined surface 1303 of the bracket 130, and the inside of the first cover 121.

In an embodiment, the inclined surface 1303 of the bracket 130 may be formed to be inclined toward the inside of the first cover 121 from the second portion 1302 of the bracket 130 such that the air-flow cross-sectional area of the fluid channel is decreased in the direction of air movement.

In an embodiment, the inclined surface 1303 may be formed such that air released through the air outlet 1641 passes through a portion the cross-sectional area of which is reduced by the inclined surface 1303. For example, the air flow path may be formed such that the portion adjacent to the air outlet 1641 has a larger cross-sectional area than the portion adjacent to the first openings 1171. The shape of the fluid channel may enable an increase in air speed released from the air outlet 1641 and may therefore have an advantage in dissipating heat generated from the electronic device 10. For example, the air speed released from the fan assembly 160 may increase with a decrease in the air-flow cross-sectional area. This means that part of the internal energy of air is converted to kinetic energy. The temperature of air may be decreased during the passage of air through the fluid channel. Furthermore, air with increasing speed may be advantageous for convection heat transfer in the recess 112.

In an embodiment, the primary source of heat, such as the processor 15 of the electronic device 10, may be disposed in a position corresponding to the recess 112.

Figure 8:
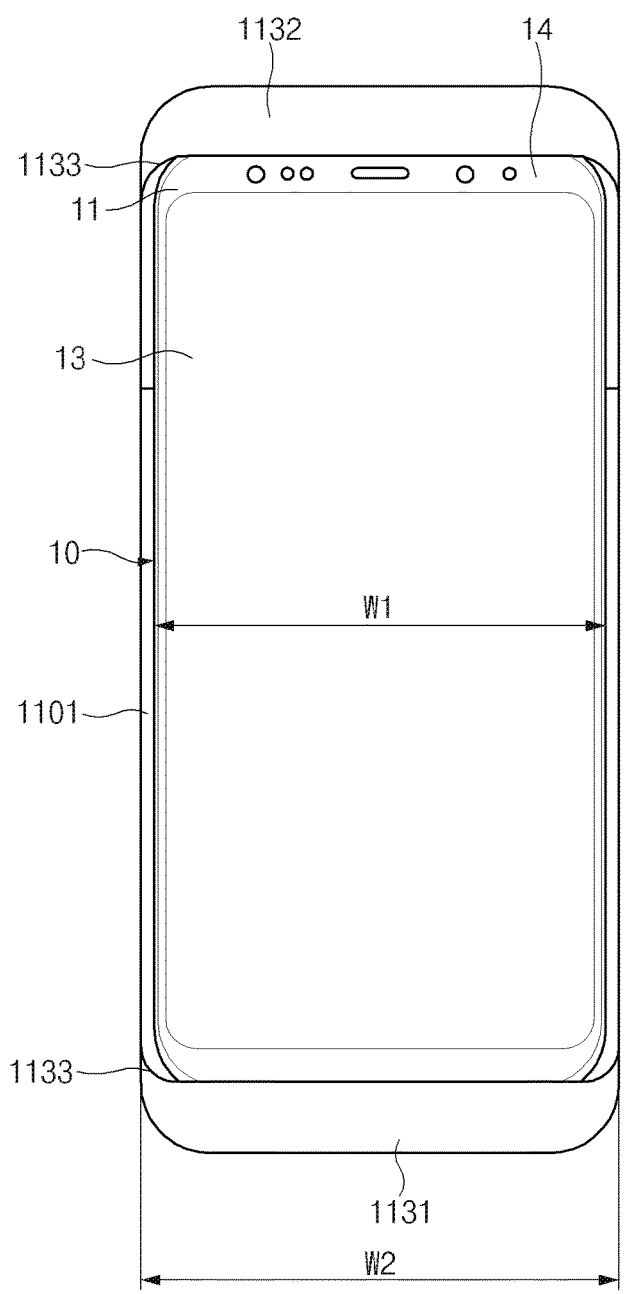
FIG. 8 is views illustrating a state in which the mobile electronic device is mounted on the cooler for the mobile electronic device according to an embodiment.
Figure 8:
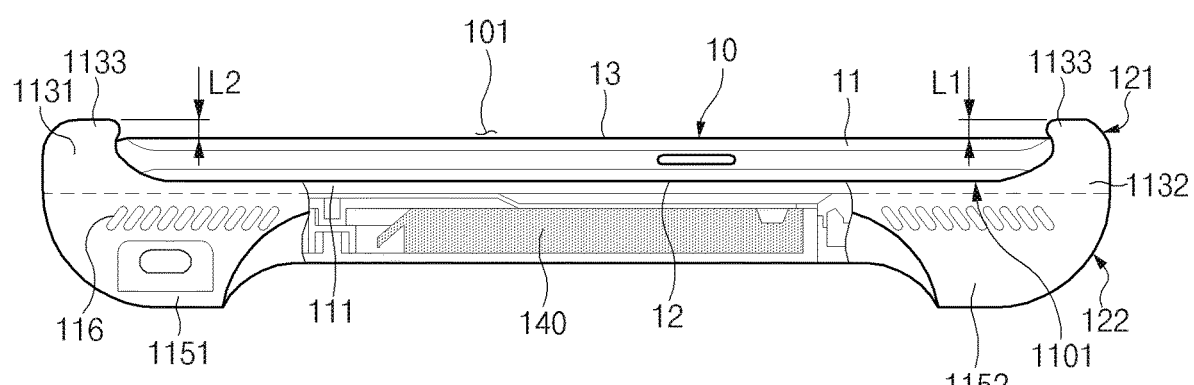

FIG. 8 is views illustrating a state in which the mobile electronic device is mounted on the cooler for the mobile electronic device according to an embodiment.

Referring to FIG. 8, the electronic device 10 may be mounted on the cooler 100 by disposing a first edge having the first length on the first fixing portion 1131 and disposing a second edge facing the first edge on the second fixing portion 1132. The electronic device 10 may include the front surface 11 on which the display area 13 is formed and the rear surface 12 opposite the front surface 11, and the rear surface 12 may be disposed on the seating areas 111 of the first cover 121 of the cooler 100.

The cooler 100 may include extensions 1133 that are formed on the first fixing portion 1131 and the second fixing portion 1132, respectively, and that at least partially cover the front surface 11 of the electronic device 10. The extension 1133 formed on the first fixing portion 1131 may extend toward the second fixing portion 1132 facing the first fixing portion 1131, and the extension 1133 formed on the second fixing portion 1132 may extend toward the first fixing portion 1131 facing the second fixing portion 1132.

In an embodiment, the first cover 121 and the front surface 1101 of the cooler 100 may face a first direction. Each of the first fixing portion 1131 and the second fixing portion 1132 may be formed on the periphery of the first cover 121 in the first direction to surround at least part of the periphery of the electronic device 10. The first fixing portion 1131 and the second fixing portion 1132 may be formed to be higher than at least the seating areas 111 of the cooler 100 in the first direction.

The first fixing portion 1131 may be formed to be higher than the front surface 11 of the electronic device 10 by a first height L1, and the second fixing portion 1132 may be formed to be higher than the front surface 11 of the electronic device 10 by a second height L2. In some embodiments, the first height L1 may be equal to the second height L2.

As illustrated in FIG. 8, the first surface 1101 including the seating areas 111 on which the electronic device 10 is seated may have a width W2 greater than the width W1 of the electronic device 10. As illustrated in FIG. 8, the extensions 1133 may extend from the fixing portions 113 to cover part of the front surface 11 of the electronic device 10. Accordingly, the cooler 100 according to the embodiment, when an external impact is applied thereto, may protect the electronic device 10 to prevent the impact from being directly applied to the electronic device 10.

In some embodiments, the cooler 100 may provide a recess 101 (e.g., the space between the first fixing portion 1131 and the second fixing portion 1132) in which the electronic device 10 is mounted. The recess 101 may have a depth greater than the thickness of the electronic device 10, and the bottom surface (e.g., the first surface 1101) of the recess 101 may have a larger area than the electronic device 10.

Figure 9A:
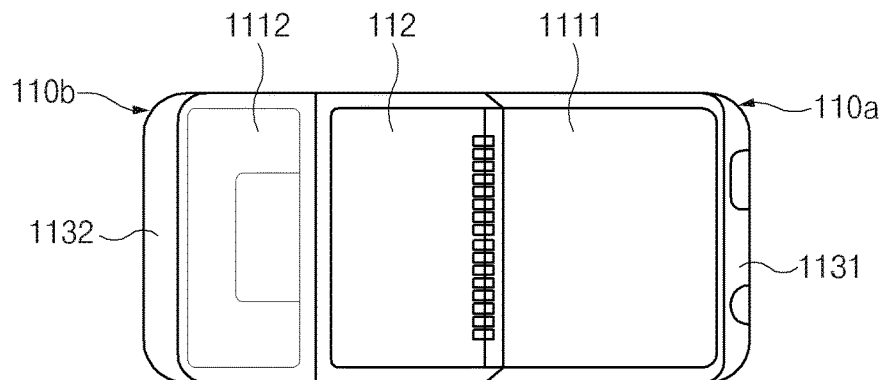
FIG. 9A, FIG. 9B, and FIG. 9C are views illustrating a method of mounting the mobile electronic device on the cooler for the mobile electronic device according to an embodiment.
Figure 9B:
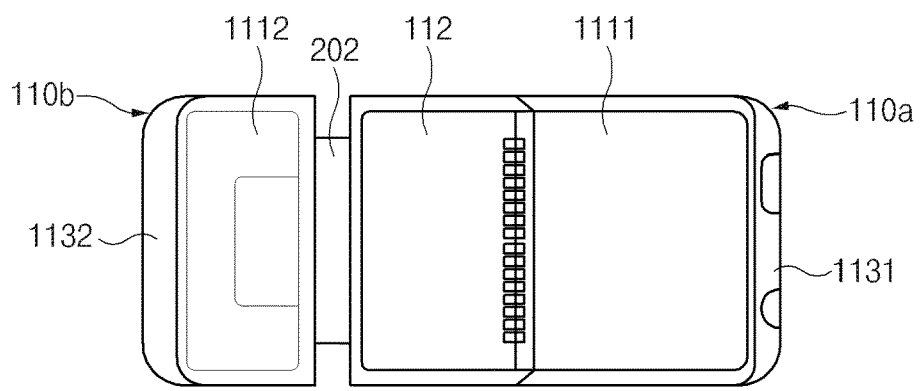
Figure 9C:
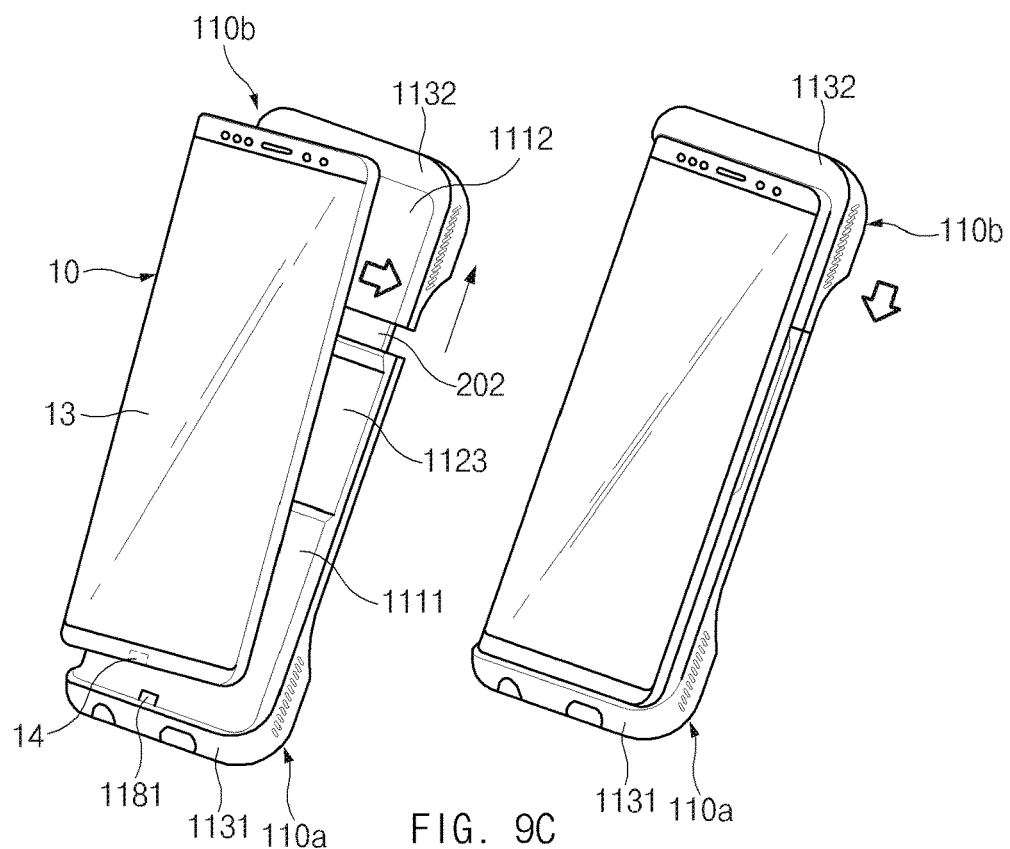

FIGS. 9A-9C are views illustrating a method of mounting the mobile electronic device on the cooler for the mobile electronic device according to an embodiment.

Referring to FIGS. 9A-9C, the cooler 100 according to an embodiment may include the first housing 110a and the second housing 110b slidably coupled to the first housing 110a. The second housing 110b may be slidably coupled to a guide plate 202 that extends from the first housing 110a. The guide plate 202 may extend from the interior of the first housing 110a to the interior of the second housing 110b.

In the illustrated embodiment, the first housing 110a may include the first seating area 1111, the recess area 112, and the first fixing portion 1131 that are formed on the first surface 1101, and the second housing 110b may include the second seating area 1112 and the second fixing portion 1132 that are formed on the first surface 1101.

In an embodiment, the cooler 100 may include the first housing 110a including the fan assembly 160 therein and the second housing 110b slidably coupled to the first housing 110a.

In the illustrated embodiment, the cooler 100 may be configured in a closed state in which the first housing 110a and the second housing 110b are brought into contact with each other and an open state in which the first housing 110a and the second housing 110b are spaced apart from each other by a predetermined gap. In some embodiments, the cooler 100 may be configured in a closed state in which the guide plate 202 is located in the first housing 110a and the second housing 110b and an open state in which at least part of the guide plate 202 is located between the first housing 110a and the second housing 110b.

Referring to FIG. 9C, the distance between the first fixing portion 1131 and the second fixing portion 1132 of the cooler 100 may be increased as the second housing 110b slides by a predetermined distance from the first housing 110a. The electronic device 10 may be mounted on the cooler 100 such that the connector 14 is coupled with the connector 1181 formed on the first fixing portion 1131 and at least part of the rear surface 12 of the electronic device 10 is seated on the first seating area 1111 of the first housing 110a and the second seating area 1112 of the second housing 110b.

After the electronic device 10 is seated on the cooler 100, the distance between the first fixing portion 1131 and the second fixing portion 1132 may be decreased as the second housing 110b slides toward the first housing 110a. At this time, the pair of edges of the electronic device 10 facing each other may be disposed on the first fixing portion 1131 and the second fixing portion 1132, and thus the electronic device 10 may be mounted on the cooler 100.

In an embodiment, the cooler 100 may provide an open state in which the rear surface 12 of the electronic device 10 is able to be seated on the seating areas 111 and a closed state in which the seated electronic device 10 is fixed. In an embodiment, the cooler 100 may be configured in an open state in which a mounting space larger than the electronic device 10 is formed and a closed state in which a mounting space corresponding to the electronic device 10 is formed.

Figure 10A:
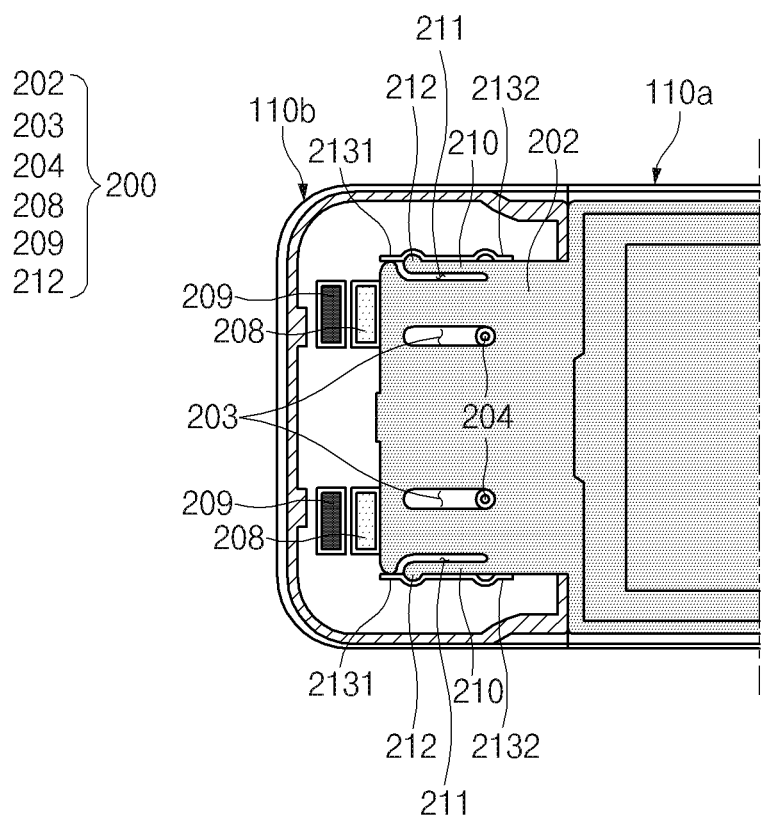
FIG. 10A and FIG. 10B are views illustrating a sliding structure and a sliding motion of the cooler for the mobile electronic device according to an embodiment.
Figure 10B:
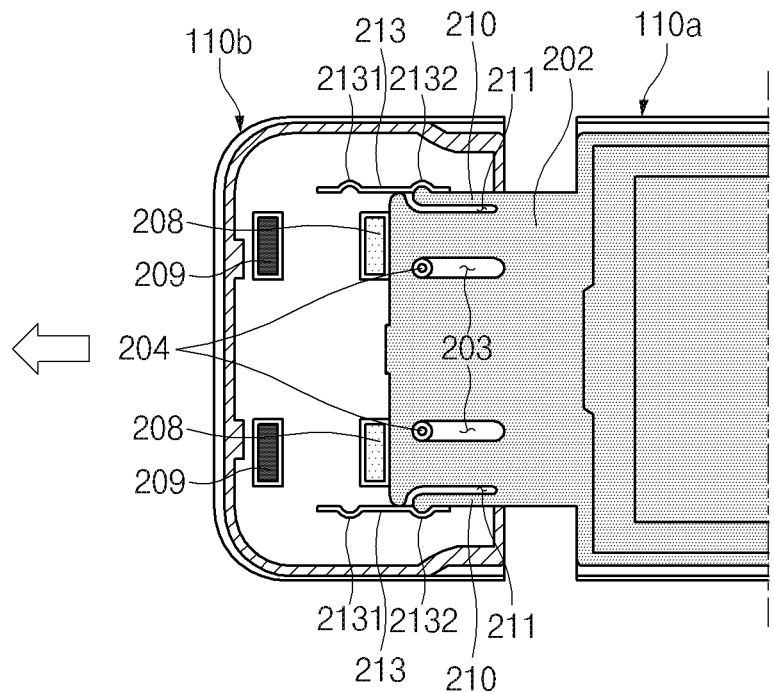

FIGS. 10A-10B are views illustrating a sliding structure and a sliding motion of the cooler for the mobile electronic device according to an embodiment.

In an embodiment, the cooler 100 may include the first housing 110a, the second housing 110b slidably coupled to the first housing 110a, and the sliding structure 200 by which the first housing 110a and the second housing 110b are slidably coupled together.

Referring to FIG. 10A, in the closed state, the first housing 110a and the second housing 110b may be brought into contact with each other. Referring to FIG. 10B, in the open state, the first housing 110a and the second housing 110b may be spaced apart from each other.

In the illustrated embodiment, the sliding structure 200 may include the guide plate 202 that extends toward the second housing 110b from the interior of the first housing 110a and that is at least partially located in the second housing 110b, a guide rail 203 formed in the guide plate 202, and a guide protrusion 204 formed on the second housing 110b and at least partially inserted into the guide rail 203.

In the illustrated embodiment, the guide plate 202 may extend from the interior of the first housing 110a in a sliding direction. In the closed state, the guide plate 202 may be located in the second housing 110b, and in the open state, at least part of the guide plate 202 may be located between the first housing 110a and the second housing 110b.

In the illustrated embodiment, the guide rails 203 may be formed in the guide plate 202 and may extend in the sliding direction. One or more guide rails 203 may be formed in the guide plate 202. The extension length of the guide rails 203 may correspond to the distance by which the first housing 110a and the second housing 110b can be maximally spaced apart from each other when the cooler 100 moves from the closed state to the open state.

In an embodiment, each of the guide rails 203 may include a first end portion closer to the first housing 110a and a second end portion closer to the second housing 110b. In the closed state, the guide protrusion 204 may be located in the first end portion of the guide rail 203. In the open state, the guide protrusion 204 may be located in the second end portion of the guide rail 203.

In an embodiment, the guide rails 203 may be formed on one surface of the guide plate 202. The one surface may be a surface that faces a direction perpendicular to the sliding direction. For example, referring to FIGS. 10A-10B, the guide rails 203 may be formed on the surface of the guide plate 202 that faces the first surface 1101 of the housing 110. However, the guide rails 203 are not necessarily formed on the surface of the guide plate 202 that faces the first surface 1101 or the second surface 1102 of the housing 110. In another example, the guide rails 203 may be formed on one surface of the guide plate 202 that is opposite the third surface 1103 of the housing 110 that faces a direction perpendicular to the sliding direction.

In an embodiment, the sliding structure 200 may include a positioning protrusion 212 formed on one surface of the guide plate 202 and positioning recesses that are formed on a facing surface 213 facing the one surface of the guide plate 202 and in which the positioning protrusion 212 is located. The one surface on which the positioning protrusion 212 is formed may be a surface that faces a direction perpendicular to the sliding direction. For example, referring to FIG. 10, the positioning protrusion 212 may protrude from the one surface of the guide plate 202 to face the direction perpendicular to the sliding direction. However, the positioning protrusion 212 is not necessarily formed on the surface of the guide plate 202 that is opposite the third surface 1103 of the housing 110. In another example, the positioning protrusion 212 may be formed on one surface of the guide plate 202 that faces the first surface 1101 or the second surface 1102 of the housing 110.

In an embodiment, a first positioning recess 2131 may be formed in a position corresponding to the second end portion of the guide rail 203. A second positioning recess 2132 may be formed in a position corresponding to the first end portion of the guide rail 203.

In an embodiment, the positioning protrusion 212 and the positioning recesses 2131 and 2132 may be formed to maintain the closed state or the open state of the cooler 100.

For example, when the cooler 100 is in the closed state, the positioning protrusion 212 may be inserted into the first positioning recess 2131, and the positions of the first housing 110a and the second housing 110b may be fixed. Alternatively, when the cooler 100 is in the open state, the positioning protrusion 212 may be inserted into the second positioning recess 2132, and the positions of the first housing 110a and the second housing 110b may be fixed.

In an embodiment, the guide plate 202 may include an elastic portion 210 on which the positioning protrusion 212 is formed. The elastic portion 210 may be formed to provide elastic force in the direction in which the positioning protrusion 212 protrudes. For example, referring to FIG. 10A and FIG. 10B, the elastic portion 210 may extend from the rest of the guide plate 202 in a direction perpendicular to the sliding direction. An opening 211 may be formed between the elastic portion 210 and the guide plate 202.

In an embodiment, the elastic portion 210 may be bent toward the opening 211 when the positioning protrusion 212 formed on the guide plate 202 is located between the first positioning recess 2131 and the second positioning recess 2132 (e.g., in an intermediate state between the closed state and the open state). The bent elastic portion 210 may be straightened to provide the elastic force when the positioning protrusion 212 is located in the first positioning recess 2131 or the second positioning recess 2132.

In an embodiment, the sliding structure 200 may include a first magnet 208 formed on the guide plate 202 and a second magnet 209 formed in the second housing 110b. The first magnet 208 and the second magnet 209 may attract each other while facing each other. For example, when the cooler 100 is in the intermediate state between the closed state and the open state, the first magnet 208 and the second magnet 209 may slide the guide plate 202 in the direction of the arrow illustrated in FIG. 10B, such that the cooler 100 is switched to the closed state. In other words, when the positioning protrusion 212 is located between the first positioning recess 2131 and the second positioning recess 2132, the first magnet 208 and the second magnet 209 may move the guide plate 202 in the direction of the arrow illustrated in FIG. 10B, such that the positioning protrusion 212 is inserted into the first positioning recess 2131.

In an embodiment, the sliding structure 200 may include an elastic member that is coupled, at one side thereof, to the second housing 110b and is coupled, at an opposite side thereof, to the guide plate 202. The elastic member may include a spring. For example, when the cooler 100 is in the open state, the spring may be extended and may provide elastic force in the direction in which the first housing 110a and the second housing 110b move toward each other, and when the cooler 100 is in the closed state, the spring may be substantially in equilibrium.

Accordingly, the cooler 100 may maintain the closed state and prevent an unintended open state when the user does not intend to open the cooler 100, thereby preventing separation of the electronic device 10 mounted on the cooler 100.

In FIG. 10A and FIG. 10B, it is shown that the guide plate 202 is included in the first housing 110a, and the guide protrusion 204, the positioning recesses 2131 and 2132, and the magnets 208 and 209 are included in the second housing 110b. However, the disclosure is not necessarily so limited. The guide protrusion 204, the positioning recesses 2131 and 2132, and the magnets 208 and 209 may be included in the first housing 110a, and the guide plate 202 may be included in the second housing 110b.

According to an embodiment, a cooler 100 may include a housing 110 including a first surface 1101, a second surface 1102 opposite the first surface 1101, and a third surface 1103 that surrounds an interior space between the first surface 1101 and the second surface 1102, the first surface 1101 including a seating area 111 on which a rear surface 12 of an electronic device 10 is seated and a recess area 112 spaced apart from the rear surface 12 of the electronic device 10 by a predetermined gap, and a fan assembly 160 disposed in the interior space of the housing 110 and including a rotary shaft 162 formed in a direction toward the first surface 1101 from the second surface 1102. The recess area 112 may include a bottom surface 123 spaced apart from the rear surface 12 of the electronic device 10 by the predetermined gap and an inner wall 1121, 1122 formed between the bottom surface 1123 and the seating area 111 and having a first opening 1171 formed through the inner wall 1121m 1122 in a direction toward the fan assembly 160 disposed in the interior space of the housing 110. The third surface 1103 has a second opening 1161 formed through the third surface 1103 in a direction toward the fan assembly 160 disposed in the interior space of the housing 110. The fan assembly 160 is configured to introduce air outside the housing 110 into the interior space of the housing 110 through the second opening 1161 and discharge the outside air to a space between the rear surface 12 of the electronic device 10 and the bottom surface 123 through the first opening 1171.

In an embodiment, the seating area 111 may include a first seating area 1111 on which a portion of the rear surface 12 of the electronic device 10 is seated and a second seating area 1112 on which another portion of the rear surface of the electronic device is seated, and the recess area 112 may be formed between the first seating area 1111 and the second seating area 1112.

In an embodiment, when the electronic device is seated in the cooler, the recess area 112 may be formed in a position corresponding to a processor 15 of the electronic device 10.

In an embodiment, the fan assembly 160 may be formed in a position corresponding to the first seating area 1111, the inner wall 1121, 1122 may include a first inner wall 1121 that connects the first seating area 1111 and the bottom surface 123 and a second inner wall 1122 that connects the second seating area 1112 and the bottom surface 123, and the first opening 1171 may be formed through the first inner wall 1121 in the direction toward the fan assembly 160.

In an embodiment, the bottom surface 123 may be formed to face substantially the same direction as the seating area 111.

In an embodiment, the rotary shaft 162 of the fan assembly 160 may extend in a first direction. The first opening 1171 may be formed in a second direction perpendicular to the first direction, and the second opening 1161 may be formed in a direction perpendicular to the first direction and the second direction.

In an embodiment, the seating area 111 may include a fixing portion 113 that surrounds at least part of a periphery of the electronic device 10.

In an embodiment, a connector 1181 may be configured to be electrically connected with the electronic device 10 may be formed on the fixing portion 113.

In an embodiment, the cooler 100 may further include a battery 140 disposed in the interior space of the housing 110, and the battery 140 may be configured to supply power to the electronic device 10 through the connector.

In an embodiment, the cooler 100 may further include a battery 140 disposed in the interior space of the housing 110, at least part of the battery 140 being disposed in a position corresponding to a processor 15 of the electronic device 10 when the electronic device is seated in the cooler. The recess area 112 may be formed between the processor 15 and the battery 140 such that the air passing through the first opening 1171 propelled by the fan assembly 160 flows between the processor 15 and the battery 140.

In an embodiment, the fan assembly 160 may further include a fan housing 161 in which the rotary shaft 162 is formed, the fan housing 161 including an air outlet 1641 formed in one surface of the fan housing 161 in a direction toward the first opening 1171 and an air inlet 1642 formed in another surface of the fan housing 161 in a direction toward the second opening 1161, and a plurality of blades 1643 that rotate about the rotary shaft 162. The one surface of the fan housing 161 and an inner surface of the housing 110 may form a fluid channel extending from the air outlet 1641 to the first opening 1171. The first opening 1171 may be smaller than the air outlet 1641 such that when the air flows along the fluid channel from the air outlet 1641 to the first opening 1171, the air speed increases.

In an embodiment, the fluid channel may have a decreasing cross-sectional area in the direction toward the first opening 1171 from the air outlet 1641.

In an embodiment, the cooler 100 may further include a bracket 130 disposed between the first surface 1101 and the second surface 1102 of the housing 110. The fan assembly 160 may be disposed between the bracket 130 and the first surface 1101 of the housing 110. The bracket 130 may include an inclined surface 1303 that extends from a portion of the fan housing 161 adjacent to the air outlet 1641 to a portion of the inner wall 1121, 1122 adjacent to the first opening 1171 and that is inclined toward the first surface 1101 of the housing 110. The inclined surface 1303, together with the inner surface of the housing 110, may form the fluid channel.

In an embodiment, the cooler 100 may further include a backflow prevention member 165 formed between an outer surface of the fan housing 161 and the inner surface of the housing 110 to prevent the air from flowing back to a space between the fan housing 161 and the inner surface of the housing 110.

In an embodiment, the cooler may further include a battery 140 disposed between the bracket 130 and the second surface 1102 of the housing 110, and the inclined surface of the bracket 130 may be formed between the fan assembly 160 and the battery 140.

In an embodiment, the cooler 100 may further include a bracket 130 disposed in the interior space of the housing 110, a battery 140 disposed on the bracket 130, and a PCB 150 disposed on the bracket 130 and electrically connected with the battery 140. The PCB 150 and the battery 140 may be disposed between the bracket 130 and the second surface 1102 of the housing 110. The fan assembly 160 may be disposed between the bracket 130 and the first surface 1101 of the housing 110.

In an embodiment, the housing 110 may include a first housing 110a, a second housing 110b slidably coupled to the first housing 110a, and a sliding structure 200 that is configured to allow sliding of the first housing 110a relative to the second housing 110b. The sliding structure 200 may include a guide plate 202 extending from the first housing 110a to an interior of the second housing 110b, a guide rail 203 formed in the guide plate 202 and extending in a sliding direction, and a guide protrusion 204 formed on the second housing and inserted into the guide rail 203. The guide rail 203 may include a first end portion relatively adjacent to the first housing and a second end portion relatively adjacent to the second housing. The cooler 100 may be configured in a first state in which the guide protrusion 204 is located in the first end portion of the guide rail 203 and a second state in which the guide protrusion 204 is located in the second end portion of the guide rail 203. In the first state, the guide plate 202 may be located entirely in the first housing 110a and the second housing 110b, and in the second state, at least a portion of the guide plate 202 may be located between the first housing 110a and the second housing 110b so that the portion of the guide plate is exposed.

In an embodiment, the sliding structure 200 may further include a first magnet 208 that is formed on the guide plate 202 and a second magnet 209 that is formed on the second housing and that faces the first magnet 208, and attractive force may be formed between the first magnet 208 and the second magnet 209.

In an embodiment, the sliding structure 200 may further include a positioning protrusion 212 that is formed on one surface of the guide plate 202 and protrudes in a direction substantially perpendicular to the sliding direction. The second housing may include a first positioning recess 2131 and a second positioning recess 2132 that are formed on a facing surface facing the one surface of the guide plate 202 and configured to receive the positioning protrusion 212. The first positioning recess 2131 may be formed in a position substantially corresponding to the first end portion of the guide rail 203, and the second positioning recess 2132 may be formed in a position substantially corresponding to the second end portion of the guide rail 203. The attractive force of the first magnet 208 and the second magnet 209 may cause the positioning protrusion 212 to be received by the second positioning recess 2132 when the positioning protrusion 212 is located between the first positioning recess 2131 and the second positioning recess 2132.

In an embodiment, the guide plate 202 may include an elastic portion 210 on which the positioning protrusion 212 is formed and that provides elastic force in a direction in which the positioning protrusion 212 substantially protrudes and an opening 211 formed in a direction opposite to the direction in which the positioning protrusion 212 protrudes. The elastic portion 210 may be formed to be bent toward the opening 211 when the positioning protrusion 212 is located between the first positioning recess 2131 and the second positioning recess 2132.

Figure 11:
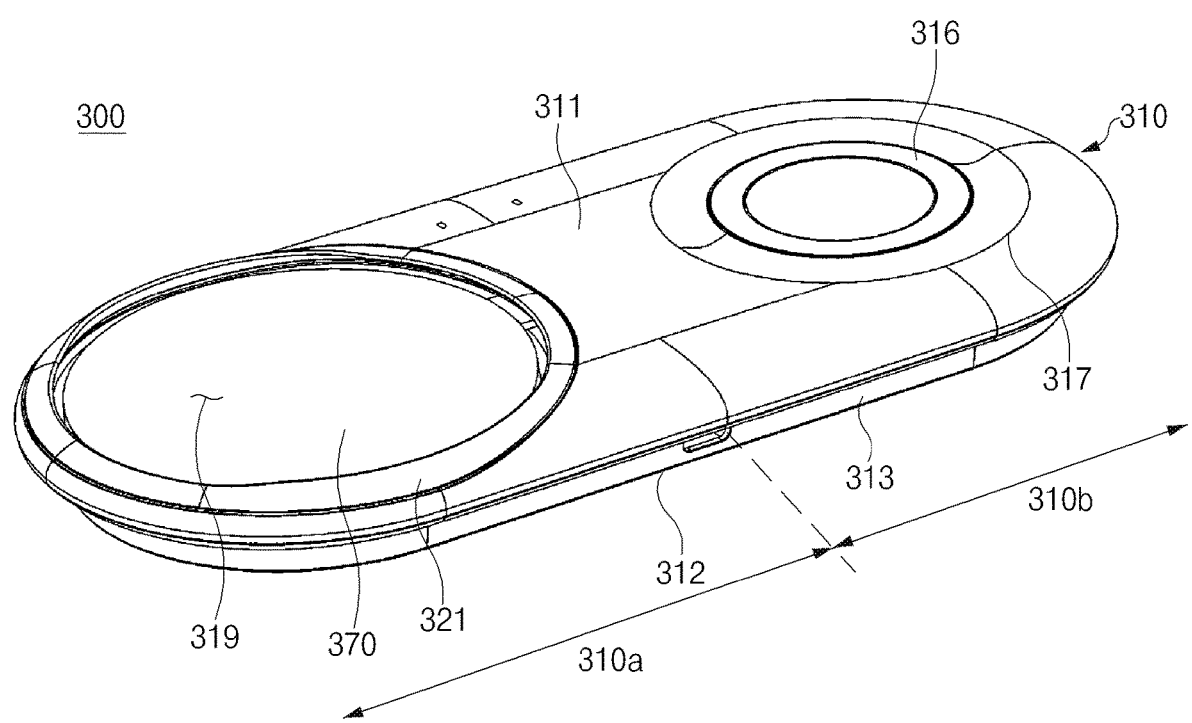
FIG. 11 is a perspective view of an accessory according to an embodiment.

FIG. 11 is a perspective view of an accessory according to an embodiment.

The accessory, which will be described below with reference to FIGS. 11 to 16, may provide a wireless charging function and a cooling function to an electronic device.

Referring to FIG. 11, the accessory 300 according to an embodiment may include a housing 310 that includes a first surface 311, a second surface 312 opposite the first surface 311, and a third surface 313 formed between the first surface 311 and the second surface 312.

In the illustrated embodiment, the housing 310 may include a first portion 310a that includes the first surface 311 on which a pad member 370 is disposed and a second portion 310b that includes the first surface 311 on which a pad area 316 is formed.

In the illustrated embodiment, the pad member 370 and a seating member 321 surrounding the pad member 370 may be disposed on the first portion 310a of the housing 310. An opening 319 may be formed in the first surface 311 of the housing 310 that is included in the first portion 310a. The pad member 370 may be disposed in the opening 319. The seating member 321 may be disposed on a peripheral area of the opening 319 of the housing 310. An electronic device (e.g., the electronic device 10 of FIG. 1) may be seated on the seating member 321. The seating member 321 may be formed to space a surface (e.g., the rear surface) of the electronic device apart from the pad member 370 by a predetermined gap.

Referring to FIG. 11, the pad member 370 and the seating member 321 may be separate components disposed on the first surface 311 of the housing 310. Without being necessarily limited thereto, however, the seating member 321 may be integrally formed with the first surface 311 of the housing 310.

In the illustrated embodiment, the pad area 316 and a seating area 317 surrounding the pad area 316 may be formed on the second portion 310b of the housing 310. The pad area 316 may be concavely formed in the direction from the first surface 311 of the housing 310 to the second surface 312 thereof. The seating area 317 may include a peripheral portion of the pad area 316. An electronic device (e.g., the electronic device 10 of FIG. 1) may be disposed on the seating area 317.

In an embodiment, the electronic device that is seated on the seating area 317 may be a portable communication device (e.g., a smartphone), a portable multimedia device, a portable medical device, a camera, a wearable electronic device (e.g., a smart watch or a smart band), or a home appliance. The electronic device according to the embodiment of the disclosure is not limited to the aforementioned devices.

In an embodiment, the first portion 310a of the housing 310 may provide a wireless charging function and a cooling function to the electronic device disposed on the seating member 321, and the second portion 310b of the housing 310 may provide a wireless charging function to the electronic device disposed on the seating area 317.

In some embodiments, the first portion 310a may be an area for providing a wireless charging function and a cooling function to an electronic device (e.g., a smartphone) that has a relatively large size, and the second portion 310b may be an area for providing a wireless charging function to an electronic device (e.g., a wearable electronic device) that has a relatively small size.

In an embodiment, electronic devices may be seated on the seating member 321 of the first portion 310a of the housing 310 and the seating area 317 of the second portion 310b of the housing 310, respectively. The accessory 300 according to an embodiment may provide a cooling function and a wireless charging function to the electronic device seated on the first portion 310a and may provide a wireless charging function to the electronic device seated on the second portion 310b.

Figure 12:
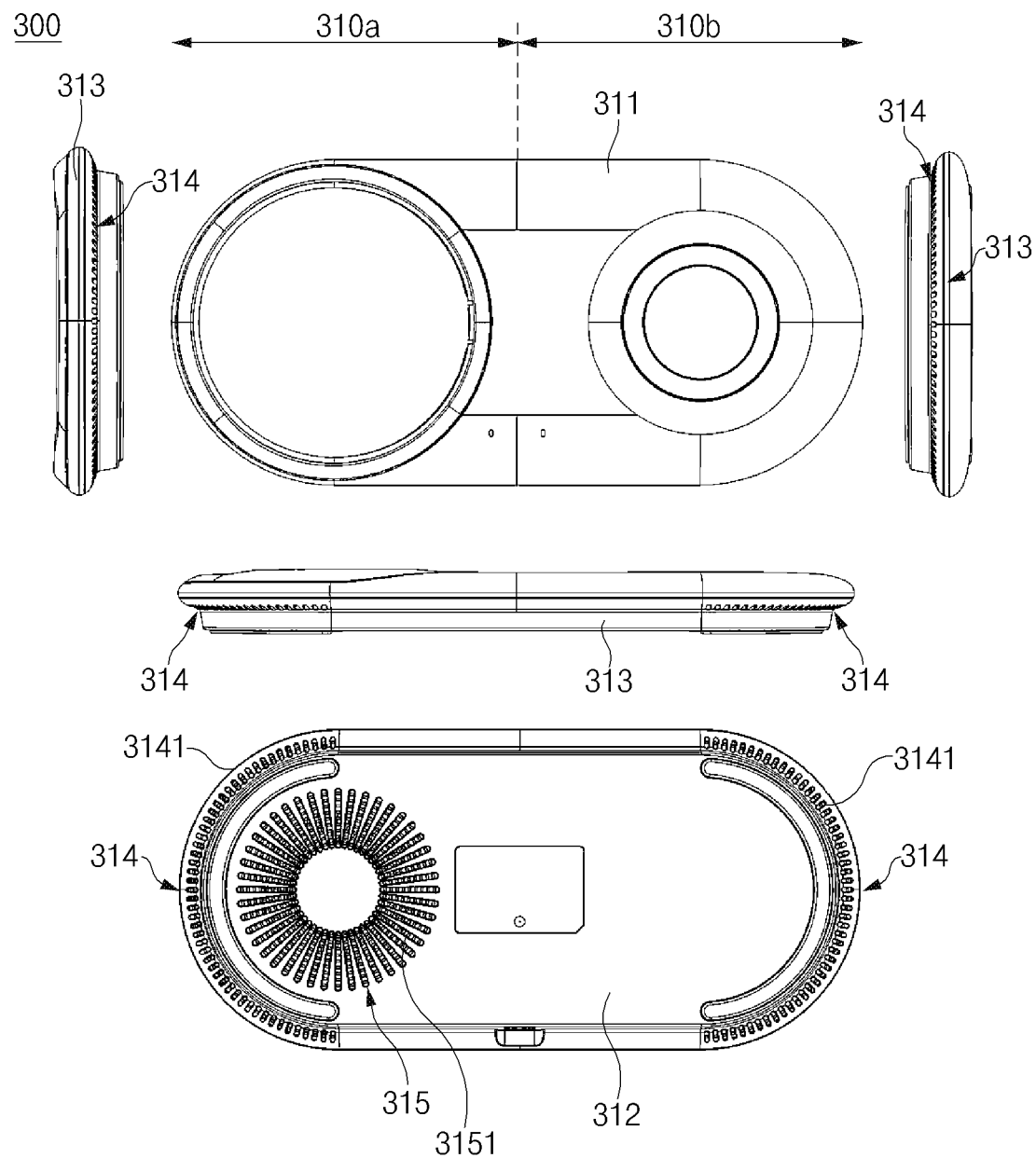
FIG. 12 is plan views of the accessory according to an embodiment.

FIG. 12 is plan views of the accessory according to an embodiment.

Referring to FIG. 12, the second surface 312 of the housing 310 may include a first intake area 315 including a plurality of first openings 3151. The first intake area 315 may be formed in an area substantially corresponding to the first portion 310a of the housing 310. For example, the first intake area 315 may include the plurality of first openings 3151 formed in the radial direction from the center of the first portion 310a. The first openings 3151 may be formed through the second surface 312 of the housing 310 to be in fluidic communication with the interior space of the housing 310.

Referring to FIG. 12, the third surface 313 of the housing 310 may include second intake areas 314, each of which includes a plurality of second openings 3141. The second openings 3141 may be formed through the third surface 313 of the housing 310 to be in fluidic communication with the interior space of the housing 310.

Figure 13:
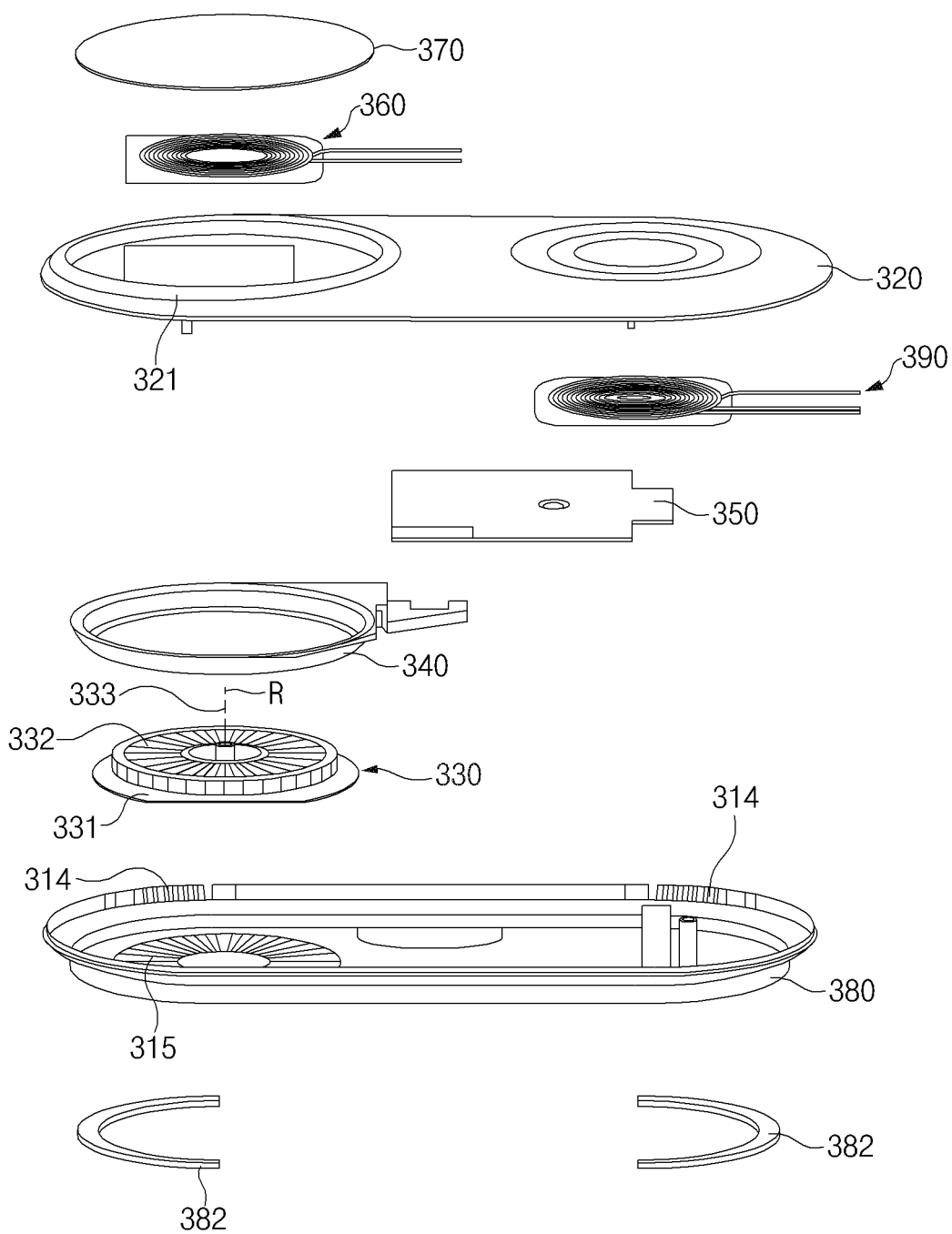
FIG. 13 is an exploded perspective view of the accessory according to an embodiment.

FIG. 13 is an exploded perspective view of the accessory according to an embodiment.

Referring to FIG. 13, the accessory 300 according to an embodiment may include a first cover 320, a second cover 380, a fan assembly 330, a duct member 340, first wireless charging circuitry 360, the pad member 370, a printed circuit board 350, and second wireless charging circuitry 390.

In the illustrated embodiment, the first cover 320 may be coupled with the second cover 380 to form the housing 310 illustrated in FIG. 11. The first cover 320 may substantially form the first surface 311 of the housing 310 and a portion of the third surface 313 of the housing 310. The opening 319 may be formed in the first cover 320. The pad member 370 and the first wireless charging circuitry 360 may be disposed in the opening 319. The first cover 320 may include a first area (e.g., corresponding to the first portion 310a of the housing 310 of FIG. 11) in which the first wireless charging circuitry 360 and the fan assembly 330 are disposed and a second area (e.g., corresponding to the second portion 310b of the housing 310 of FIG. 11) in which the second wireless charging circuitry 390 is disposed. The first cover 320 may be coupled with the second cover 380 to form a space in which the fan assembly 330, the duct member 340, the second wireless charging circuitry 390, and the printed circuit board 350 are disposed.

In the illustrated embodiment, the printed circuit board 350 may be formed on the inside of the first cover 320 so as to be adjacent to the first wireless charging circuitry 360 and the second wireless charging circuitry 390.

In the illustrated embodiment, the second cover 380 may substantially form the second surface 312 of the housing 310 and the remaining portion of the third surface 313 of the housing 310. The second cover 380 may include the first intake area 315 including the plurality of first openings 3151 formed through the second surface 312 of the housing 310 and the second intake areas 314, each of which includes the plurality of second openings 3141 formed through the third surface 313 of the housing 310.

In the illustrated embodiment, the fan assembly 330 may be disposed under the opening 319 formed in the first cover 320. The fan assembly 330 may be in fluidic communication with the first cover 320 through the duct member 340. The fan assembly 330 may include a fan bracket 331, a rotary shaft 333 disposed on the fan bracket 331, and a plurality of rotary blades 332 extending from the rotary shaft 333 in the radial direction. The rotary shaft 333 may extend in the same direction R as the direction that the fan bracket 331 faces. The fan bracket 331 may be connected with the duct member 340. Accordingly, the duct member 340 may connect the fan bracket 331 and the inside of the first cover 320 to form an enclosed space. The fan bracket 331 and the duct member 340 may prevent air flowing from the fan assembly 330 from being released to other interior spaces in the first cover 320 and the second cover 380. In some embodiments, the housing 310 may have a recess structure, the duct member 340 may form the inner wall of the recess structure, and the fan bracket 331 may form the bottom of the recess structure.

In the illustrated embodiment, the second cover 380 may include support members 382 coupled to the lower surface thereof. The support members 382 may space the second cover 380 apart from the ground by a predetermined gap to allow air to smoothly flow into the first intake area 315 formed on the second cover 380.

Figures 14A, 14B:
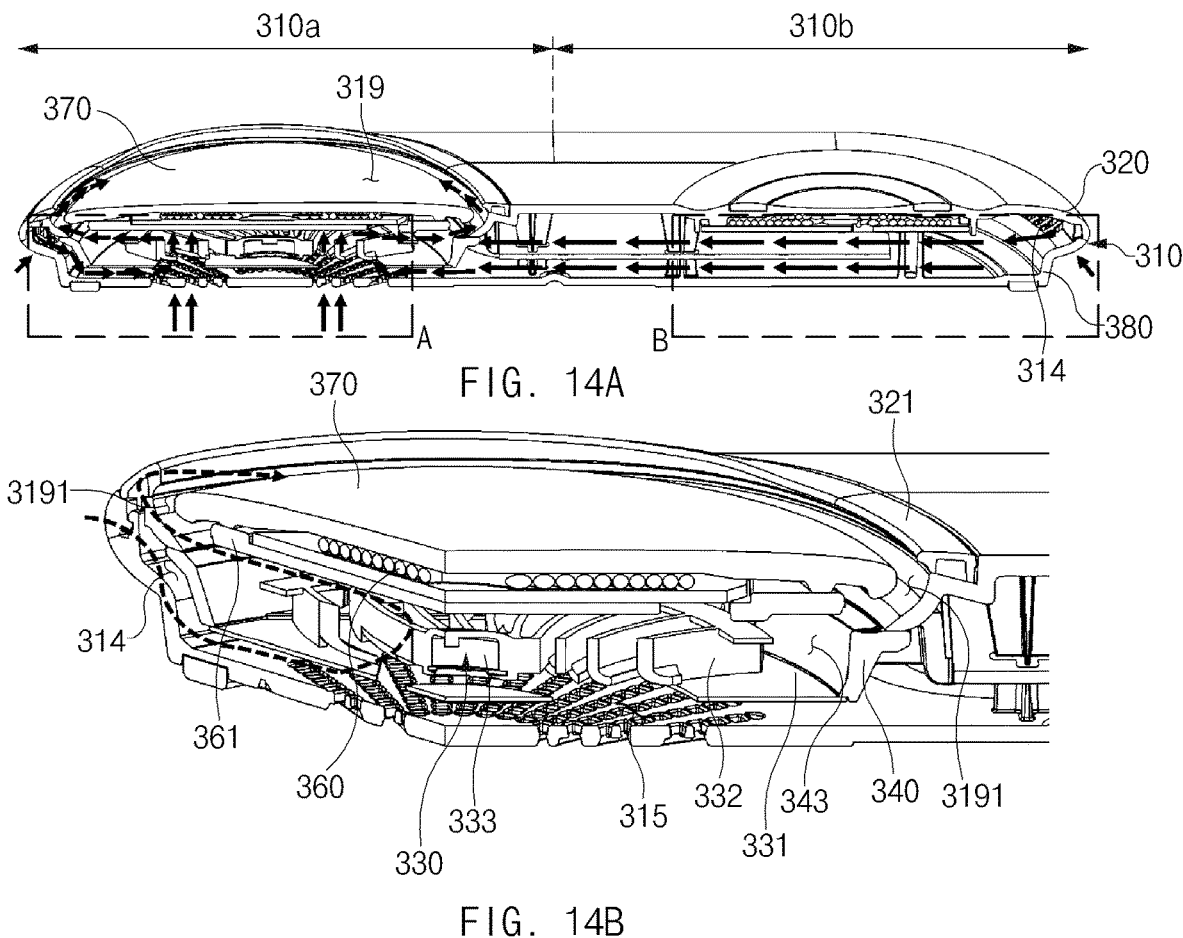
FIG. 14A and FIG. 14B are views illustrating an air flow path in the accessory according to an embodiment.

FIG. 14A and FIG. 14B are views illustrating an air flow path in the accessory according to an embodiment.

Referring to FIG. 14A and FIG. 14B, outside air may be introduced into the housing 310 through the second intake areas 314 and the first intake area 315 that are formed on the second cover 380. Air introduced through the second intake areas 314 may be moved toward the first portion 310a of the housing 310 by operation of the fan assembly 330.

Referring to FIG. 14B, an enclosed space 343 connected to the opening 319 may be formed in the housing 310. The enclosed space 343 may be formed by the fan bracket 331, the duct member 340, and the inside of the first cover 320 that are connected together. For example, the fan assembly 330 may be disposed in the housing 310 such that the fan bracket 331 forms the bottom of the enclosed space 343 and the rotary shaft 333 is formed in the direction toward the bottom of the enclosed space 343. The duct member 340 formed to surround the plurality of rotary blades 332 may be disposed on the fan bracket 331. The duct member 340 may be coupled, at one side thereof, with the inside of the first cover 320 and may be coupled, at an opposite side thereof, with the fan bracket 331.

In the illustrated embodiment, the first wireless charging circuitry 360 may be disposed in the enclosed space 343. The first wireless charging circuitry 360 may be disposed on a support plate 361 connected to the inner circumferential surface of the opening 319 of the first cover 320. The first wireless charging circuitry 360 may be disposed to be spaced apart from the fan assembly 330 by a predetermined gap.

In the illustrated embodiment, the duct member 340 may have a conical shape that increases in diameter toward the first surface 311 of the housing 310. The pad member 370 may be formed to be larger than the duct member 340. The fan bracket 331 of the fan assembly 330 may be formed to be smaller than the pad member 370. Accordingly, when the first surface 311 of the housing 310 is viewed from above, the pad member 370 may prevent the fan bracket 331 and the inner wall of the duct member 340 from being exposed to the outside. In the case where the fan bracket 331 and the duct member 340 are visually exposed through the first surface 311 of the housing 310, the visual appearance of the accessory may be deteriorated. Alternatively, in the case where air released from the fan assembly 330 is directly discharged to the user through the opening 319 of the housing 310 (e.g., direct wind), the user may feel an inconvenience. Accordingly, as illustrated in the drawing, the pad member 370 may be formed to be larger than the fan assembly 330, the first wireless charging circuitry 360, and the duct member 340 to allow air released from the fan assembly 330 to be discharged out of the housing 310 through between the pad member 370 and the inner circumferential surface of the opening 319 while flowing along the lower surface of the first wireless charging circuitry 360. That is, by forming the air flow path in the form of a curve, air may not be directly discharged to the user (e.g., indirect wind) even in the case where no electronic device is mounted on the pad member 370.

In an embodiment, air for cooling the second wireless charging circuitry 390 and the printed circuit board 350 may be introduced through the second intake area 314 adjacent to the second portion 310b.

In an embodiment, outside air introduced through the first intake area 315 and the second intake area 314 that is adjacent to the first portion 310a may flow toward the lower surface of the first wireless charging circuitry 360 by the fan assembly 330.

In the illustrated embodiment, the flow path of air in the housing 310 may be broadly classified into two flow paths. The first flow path A may be a path along which air is introduced into the first portion 310a of the housing 310 and is discharged via the first wireless charging circuitry 360 and the pad member 370. The second flow path B may be a path along which air is introduced into the second portion 310b of the housing 310 and is moved toward the first portion 310a. Part of air flowing along the second flow path B may be used to cool the printed circuit board 350 and the second wireless charging circuitry 390.

In the illustrated embodiment, air introduced through the first intake area 315 and the second intake area 314 may be introduced, along the first flow path A, between the rotary blades 332 through an opening formed in the fan bracket 331 of the fan assembly 330. The air may be drawn into the opening 319 through the enclosed space 343 defined by the duct member 340 by the rotary blades 332. At this time, the pad member 370 and the peripheral area of the opening 319 may be spaced apart from each other by a predetermined gap 3191. The air may be discharged toward the electronic device mounted on the seating member 321, which is disposed on top of the opening 319, through the gap 3191. Accordingly, the electronic device may be cooled.

In an embodiment, the seating member 321 may be formed on the peripheral area of the opening 319, and the pad member 370 spaced apart from the peripheral area of the opening 319 by the predetermined gap 3191 may be disposed in the opening 319. For example, the pad member 370 may be formed to be smaller than the opening 319. Air in the housing 310 may be discharged to the surface of the housing 310 through the gap 3191. At this time, the pad member 370 may have a predetermined height difference from the seating member 321. The height difference may define a space to which air released from the interior of the housing 310 is finally discharged.

The accessory 300 according to an embodiment may simultaneously provide a wireless charging function and a cooling function. So as to dissipate heat generated from the first wireless charging circuitry 360 as well as simply cooling the electronic device, the accessory 300 may include the first wireless charging circuitry 360 stacked in the discharge direction of the fan assembly 330. Furthermore, at least part of an air flow path (e.g., the flow path B) that is formed in the housing 310 of the accessory 300 may pass through the second wireless charging circuitry 390 and the printed circuit board 350 to dissipate heat generated from the second wireless charging circuitry 390 and the printed circuit board 350.

In some embodiments, an electronic device may include a function of preventing overheating by lowering a wireless charging rate when the temperature of the electronic device is higher than or equal to a specific temperature. In this case, the accessory 300 disclosed herein may simultaneously provide wireless charging and cooling to the electronic device, thereby preventing overheating of the electronic device and preventing the reduction in the charging rate. In an embodiment, the first wireless charging circuitry 360 may have a relatively high output (e.g., fast charging), compared with the second wireless charging circuitry 390.

In an embodiment, the first wireless charging circuitry 360 may be formed to be thinner than the second wireless charging circuitry 390. For example, the first wireless charging circuitry 360 may include a single coil, and the second wireless charging circuitry 390 may include a double coil having single coils stacked on each other. The first wireless charging circuitry 360 and the electronic device may be spaced apart from each other by a predetermined gap to form an air flow path therebetween. The first wireless charging circuitry 360 may include a relatively thin coil such that the gap does not affect the charging function of the first wireless charging circuitry 360.

In an embodiment, the second wireless charging circuitry 390 may include a Tx coil having a relatively small outer diameter. The aim may be to stably provide wireless charging to an electronic device, such as a wearable electronic device (e.g., a smart watch or a smart band), which includes an Rx coil having a relatively small outer diameter. For example, in the case where the second wireless charging circuitry 390 includes a Tx coil having a relatively large outer diameter, the Tx coil having the relatively large outer diameter may affect another metal portion (e.g., a display or a housing) of the wearable electronic device.

In an embodiment, the second wireless charging circuitry 390 may include a Tx coil stacked in the form of a double coil. The aim may be to efficiently provide wireless charging to a wearable electronic device (e.g., a smart watch or a smart band). Wireless charging efficiency may be improved with an increase in the area where a coil is formed and the number of times that the coil is wound. Accordingly, the second wireless charging circuitry 390 may include a Tx coil that has a relatively small outer diameter and that is formed by stacking, thereby efficiently providing wireless charging to a wearable electronic device having a small Rx coil.

In an embodiment, the seating member 321 may include a ring member having a substantially ring shape. At least part of the seating member 321 may further protrude beyond the first surface 311 of the housing 310. The aim may be to form an air flow path between the rest of the seating member 321 and an electronic device when the electronic device is seated on the protrusion of the seating member 321.

Figure 15:
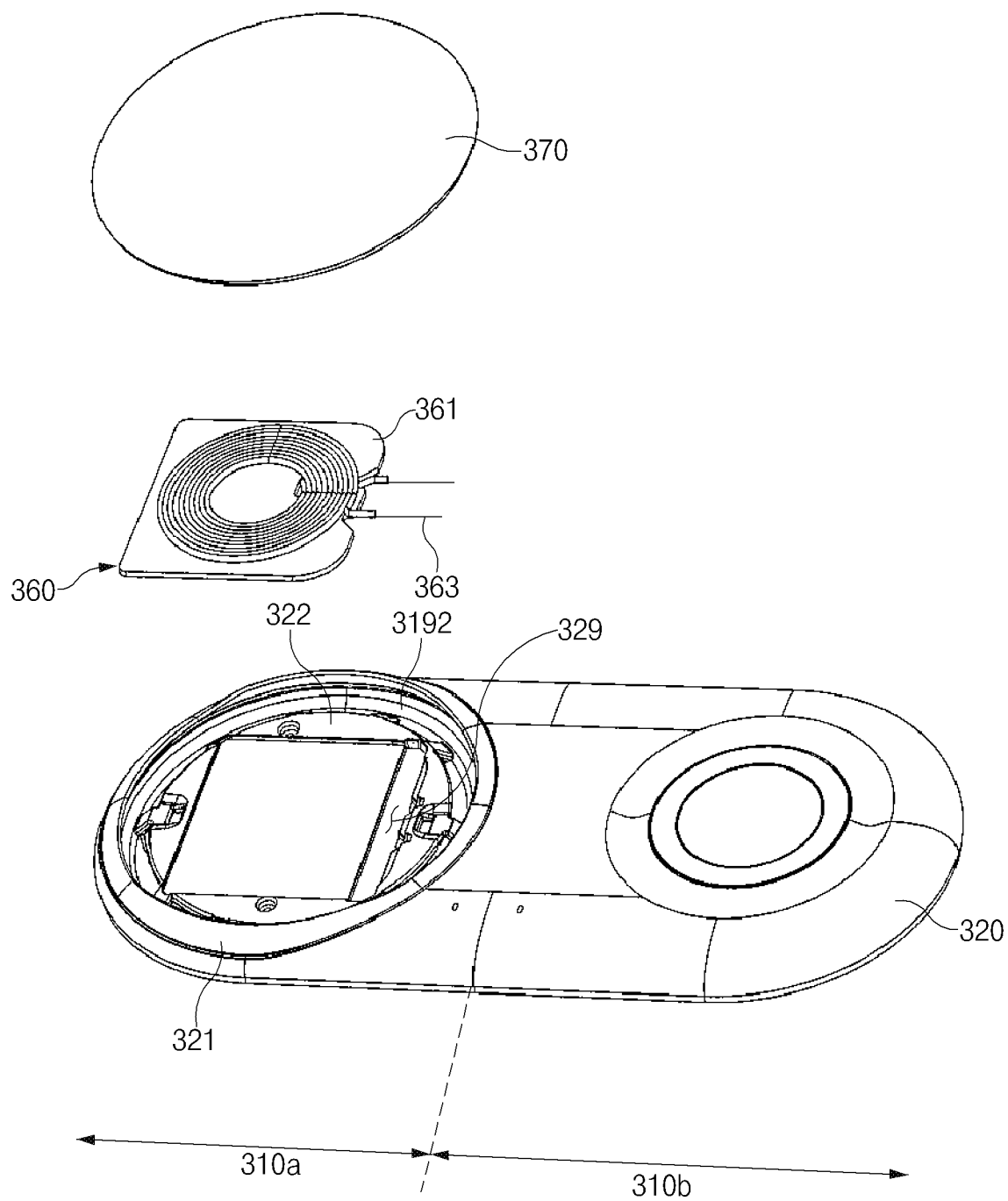
FIG. 15 is a view illustrating a coupling of first wireless charging circuitry, a duct member, and a fan assembly of the accessory according to an embodiment.

FIG. 15 is a view illustrating the coupling of the first wireless charging circuitry, the duct member, and the fan assembly of the accessory according to an embodiment.

Referring to FIG. 15, the first wireless charging circuitry 360 may be disposed on a plate structure 322 in the opening 319 formed in the first cover 320. The plate structure 322 may be connected with the inner circumferential surface of the opening 319 of the first cover 320. The plate structure 322 may have a through-hole 329 formed therein, through which a connecting member 363 extending from the first wireless charging circuitry 360 can pass to connect to a printed circuit board (e.g., the printed circuit board 350 of FIG. 13). The connecting member 363 may extend into the first cover 320 through the through-hole 329.

In the illustrated embodiment, the pad member 370 may be disposed over the plate structure 322. The first wireless charging circuitry 360 may be disposed between the plate structure 322 and the pad member 370. The first wireless charging circuitry 360 may be coupled to the first cover 320 by coupling the support plate 361 to the plate structure 322.

The opening 319 may be formed to be larger than the pad member 370, and therefore the periphery of the pad member 370 and the inner circumferential surface of the opening 319 may be spaced apart from each other by at least a predetermined gap.

In the illustrated embodiment, at least part of the seating member 321 may further protrude beyond the pad member 370 in the direction toward the first surface 311 of the housing 310. Accordingly, a surface (e.g., the rear surface) of an electronic device (e.g., the electronic device 10 of FIG. 1) may be spaced apart from the pad member 370 by a predetermined gap. Furthermore, the electronic device may be spaced apart from the first wireless charging circuitry 360 by a predetermined gap, and the predetermined gap may be an appropriate distance at which the first wireless charging circuitry 360 is capable of providing a wireless charging function to the electronic device.

Figure 16:
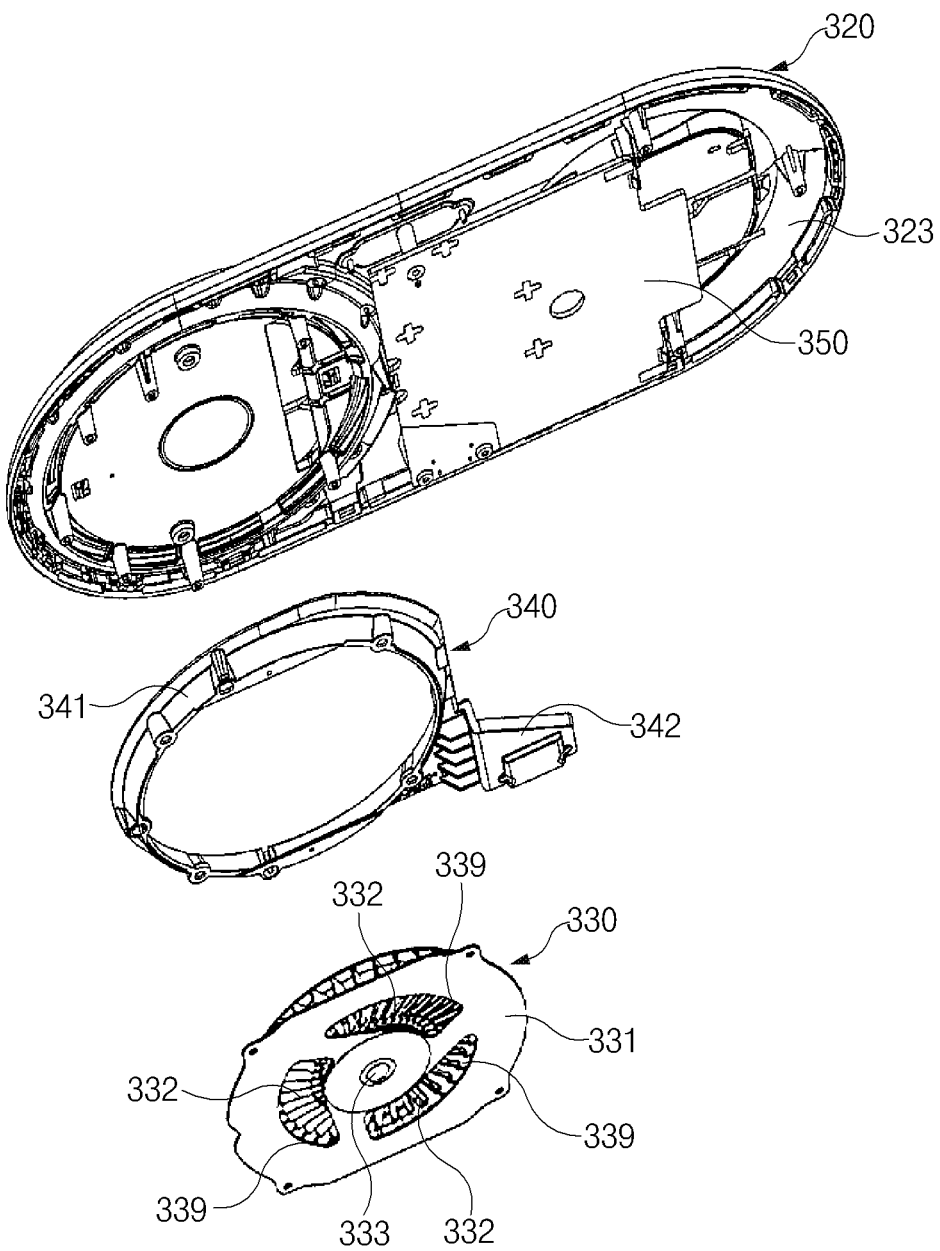
FIG. 16 is a view illustrating a coupling of the fan assembly, the duct member, and a first cover of the accessory according to an embodiment.

FIG. 16 is a view illustrating the coupling of the fan assembly, the duct member, and the first cover of the accessory according to an embodiment.

Referring to FIG. 16, the fan bracket 331 may be connected with the duct member 340, and the duct member 340 may be connected with an inner surface 323 of the first cover 320. The duct member 340 may be formed between the fan bracket 331 and the inner surface 323 of the first cover 320. Accordingly, the duct member 340 may form a fluid channel (e.g., the enclosed space 343 of FIG. 14B) that is enclosed such that air released from the fan assembly 330 is discharged toward the opening 319.

In the illustrated embodiment, the duct member 340 may include a fastening part 342 coupled to the inner surface 323 of the first cover 320 with a screw and a sidewall part 341 substantially corresponding to the peripheral area of the opening 319. One side of the sidewall part 341 may be coupled with the fan bracket 331, and an opposite side of the sidewall part 341 may be located on the peripheral area of the opening 319 that is located on the inner surface 323 of the first cover 320.

In the illustrated embodiment, the fan bracket 331 may have one or more air inlets 339 formed therein. The air inlets 339 may be formed to have a size substantially corresponding to the radius of rotation of the plurality of rotary blades 332 of the fan assembly 330. Accordingly, air in the housing 310 is able to move only in the direction toward the pad member 370 through the fan bracket 331 and is unable to move in the reverse direction. That is, the structure may prevent backflow of air introduced into the interior space of the duct member 340 by the fan assembly 330.

The cooler for the mobile electronic device according to certain embodiments of the disclosure may optimize the fluid channel from the area of the processor, which is the primary heat-generating component of the mobile electronic device, to the fan assembly, thereby achieving high cooling efficiency. Furthermore, the cooler for the mobile electronic device may provide a mounting structure in which an external impact is not directly applied to the mobile electronic device. In addition, the cooler for the mobile electronic device may charge the mobile electronic device mounted on the cooler, by using the separate battery included in the cooler.

In addition, the disclosure may provide various effects that are directly or indirectly recognized.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related components. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if a component (e.g., a first component) is referred to, with or without the term "operatively" or "communicatively", as "coupled with," "coupled to," "connected with," or "connected to" another component (e.g., a second component), it means that the component may be coupled with the other component directly (e.g., wiredly), wirelessly, or via a third component.

According to the situation, the expression "adapted to or configured to" used herein may be interchangeably used as, for example, the expression "suitable for", "having the capacity to", "changed to", "made to", "capable of" or "designed to" in hardware or software. The expression "a device configured to" may mean that the device is "capable of" operating together with another device or other components. For example, a "processor configured to (or set to) perform A, B, and C" may mean a dedicated processor (e.g., an embedded processor) for performing corresponding operations or a generic-purpose processor (e.g., a central processing unit (CPU) or an application processor) which performs corresponding operations by executing one or more software programs which are stored in a memory device.

The term "module" used herein may include a unit, which is implemented with hardware, software, or firmware, and may be interchangeably used with the terms "logic", "logical block", "component", "circuit", or the like. The "module" may be a minimum unit of an integrated component or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

According to various embodiments, at least a part of an apparatus (e.g., modules or functions thereof) or a method (e.g., operations) may be, for example, implemented by instructions stored in a computer-readable storage media (e.g., the memory 130) in the form of a program module. The instruction, when executed by a processor (e.g., a processor 120), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An accessory for an electronic device, the accessory comprising:
    a housing including a first portion including an opening and formed to provide cooling and wireless charging to the electronic device and a second portion extending to one side from the first portion and formed to provide wireless charging;
    a fan assembly disposed in the first portion of the housing and configured to discharge air through the opening, the fan assembly including a fan bracket configured to support a rotary shaft and a plurality of rotary blades of the fan assembly;
    first wireless charging circuitry disposed over the fan assembly, the first wireless charging circuitry being disposed in an area corresponding to the opening and including a first wireless charging coil;
    a pad member configured to cover the first wireless charging circuitry;
    a duct member configured to connect the fan bracket and a peripheral area of the opening; and
    second wireless charging circuitry disposed in the second portion of the housing and including a second wireless charging coil,
    wherein the plurality of rotary blades is disposed in an enclosed space defined by the fan bracket, the duct member, and the peripheral area of the opening, and
    wherein the pad member is larger than the fan assembly but is smaller than the opening, such that air from the fan assembly is discharged between the pad member and the peripheral area of the opening.

2. The accessory of claim 1, wherein the first wireless charging coil is a single coil,
    wherein the second wireless charging coil is a double coil, and
    wherein the second wireless charging coil has a smaller outer diameter than the first wireless charging coil, or the first wireless charging circuitry has a relatively high output compared with the second wireless charging circuitry.

3. The accessory of claim 1,
    wherein the duct member surrounds the plurality of rotary blades and the first wireless charging circuitry.

4. The accessory of claim 3, wherein the peripheral area of the opening is formed such that the electronic device is seated on the peripheral area, and wherein the pad member is disposed to be spaced apart from one surface of the electronic device by at least a predetermined gap.

5. The accessory of claim 1, wherein a first surface included in the second portion of the housing includes a pad area formed in an area corresponding to the second wireless charging circuitry, and wherein the pad area is configured to seat a wearable electronic device.

6. The accessory of claim 1, wherein the pad member is disposed to be spaced apart from an inner circumferential surface of the opening by a predetermined gap.

7. The accessory of claim 1, wherein the first wireless charging circuitry and the fan assembly are hidden by the pad member in a top view of the first portion of the housing.

8. The accessory of claim 1, wherein a first intake area including a plurality of first openings is formed on a second surface and a third surface that are included in the first portion of the housing, and wherein air introduced into the housing through the first intake area is discharged through the opening by the fan assembly.

9. The accessory of claim 8, wherein a printed circuit board having a control module mounted thereon is disposed between the first portion and the second portion, the control module being configured to control the first wireless charging circuitry, the second wireless charging circuitry, and the fan assembly, wherein a second intake area including a plurality of second openings formed through the housing is formed on the second portion, and wherein the fan assembly is configured to introduce air into the housing through the second intake area and move the introduced air to the first portion such that the air passes over the printed circuit board and the second wireless charging circuitry.

10. The accessory of claim 1, further comprising:

a seating member disposed on a peripheral area of the opening, wherein the seating member includes a protrusion on which the electronic device is seated.

* * * * *